(12) United States Patent
Han

(10) Patent No.: US 9,583,353 B2
(45) Date of Patent: Feb. 28, 2017

(54) LATERAL ELECTROCHEMICAL ETCHING OF III-NITRIDE MATERIALS FOR MICROFABRICATION

(71) Applicant: YALE UNIVERSITY, New Haven, CT (US)

(72) Inventor: Jung Han, Woodbridge, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 13/923,248

(22) Filed: Jun. 20, 2013

(65) Prior Publication Data

US 2014/0003458 A1     Jan. 2, 2014

Related U.S. Application Data

(60) Provisional application No. 61/665,617, filed on Jun. 28, 2012.

(51) Int. Cl.
    *H01L 21/00*           (2006.01)
    *H01L 21/306*       (2006.01)
    (Continued)

(52) U.S. Cl.
    CPC ........ *H01L 21/30612* (2013.01); *B82Y 20/00* (2013.01); *H01L 21/306* (2013.01); *H01L 21/30635* (2013.01); *H01S 5/18341* (2013.01); *H01S 5/18363* (2013.01); *H01S 5/18369* (2013.01); *H01S 5/343* (2013.01);
    (Continued)

(58) Field of Classification Search
    CPC ....... H01L 21/66; H01L 21/302; H01L 29/22; H01L 21/31

USPC ........ 438/335, 338–339, 345–346, 688, 689, 438/704; 257/E21.232; 216/72, 86, 96, 216/104, 109; 372/50.11, 99

See application file for complete search history.

(56) References Cited

U.S. PATENT DOCUMENTS

| | | |
|---|---|---|
| 5,262,021 A | 11/1993 | Lehmann et al. |
| 5,509,026 A | 4/1996 | Sasaki et al. |

(Continued)

FOREIGN PATENT DOCUMENTS

| | | |
|---|---|---|
| CN | 101443887 A | 5/2009 |
| JP | H05-315316 A | 11/1993 |

(Continued)

OTHER PUBLICATIONS

English translation of KR 20000038997 A.*

(Continued)

*Primary Examiner* — Jessica Manno
*Assistant Examiner* — Sheikh Maruf
(74) *Attorney, Agent, or Firm* — Wolf, Greenfield & Sacks, P.C.

(57) ABSTRACT

Conductivity-selective lateral etching of III-nitride materials is described. Methods and structures for making vertical cavity surface emitting lasers with distributed Bragg reflectors via electrochemical etching are described. Layer-selective, lateral electrochemical etching of multi-layer stacks is employed to form semiconductor/air DBR structures adjacent active multiple quantum well regions of the lasers. The electrochemical etching techniques are suitable for high-volume production of lasers and other III-nitride devices, such as lasers, HEMT transistors, power transistors, MEMs structures, and LEDs.

35 Claims, 14 Drawing Sheets

(51) Int. Cl.
*H01S 5/343* (2006.01)
*H01L 21/3063* (2006.01)
*H01S 5/183* (2006.01)
*B82Y 20/00* (2011.01)
*H01L 33/00* (2010.01)
*H01L 33/10* (2010.01)

(52) U.S. Cl.
CPC ........ *H01L 33/0075* (2013.01); *H01L 33/105* (2013.01); *H01L 2924/0002* (2013.01); *H01S 5/34333* (2013.01)

(56) References Cited

U.S. PATENT DOCUMENTS

| | | | |
|---|---|---|---|
| 5,644,156 A | 7/1997 | Suzuki et al. | |
| 5,818,861 A | 10/1998 | Tan et al. | |
| 6,306,672 B1* | 10/2001 | Kim | B82Y 20/00 438/22 |
| 6,320,206 B1* | 11/2001 | Coman et al. | 257/94 |
| 6,537,838 B2 | 3/2003 | Stockman | |
| 6,597,490 B2* | 7/2003 | Tayebati | G02B 26/001 359/291 |
| 6,759,310 B2 | 7/2004 | Tayanaka | |
| 6,990,132 B2 | 1/2006 | Kneissl et al. | |
| 7,989,323 B2 | 8/2011 | Shenai-Khatkhate | |
| 8,343,788 B2 | 1/2013 | Kuo et al. | |
| 8,344,409 B2 | 1/2013 | Peng et al. | |
| 8,497,171 B1 | 7/2013 | Wu et al. | |
| 8,507,925 B2 | 8/2013 | Kuo et al. | |
| 8,519,430 B2 | 8/2013 | Peng et al. | |
| 2002/0036295 A1* | 3/2002 | Nunoue | B82Y 20/00 257/98 |
| 2002/0070125 A1 | 6/2002 | Ng et al. | |
| 2002/0075929 A1 | 6/2002 | Cunningham | |
| 2003/0178633 A1* | 9/2003 | Flynn et al. | 257/101 |
| 2004/0021147 A1* | 2/2004 | Ishibashi | H01L 33/007 257/103 |
| 2005/0029224 A1 | 2/2005 | Aspar et al. | |
| 2005/0184307 A1 | 8/2005 | Li et al. | |
| 2005/0224816 A1 | 10/2005 | Kim et al. | |
| 2006/0046513 A1* | 3/2006 | Shea et al. | 438/774 |
| 2006/0110926 A1* | 5/2006 | Hu | B82Y 20/00 438/708 |
| 2006/0199353 A1 | 9/2006 | Kub et al. | |
| 2007/0007241 A1* | 1/2007 | DeLouise | 216/56 |
| 2007/0085100 A1 | 4/2007 | Diana et al. | |
| 2007/0284607 A1 | 12/2007 | Epler et al. | |
| 2008/0029773 A1* | 2/2008 | Jorgenson | H01L 33/105 257/94 |
| 2008/0179605 A1* | 7/2008 | Takase | H01L 33/32 257/94 |
| 2008/0280140 A1 | 11/2008 | Ferrari et al. | |
| 2008/0296173 A1 | 12/2008 | Mishra | |
| 2008/0298419 A1 | 12/2008 | Hori et al. | |
| 2009/0001416 A1* | 1/2009 | Chua et al. | 257/190 |
| 2009/0143227 A1 | 6/2009 | Dubrow et al. | |
| 2009/0168819 A1 | 7/2009 | Otoma | |
| 2010/0195689 A1* | 8/2010 | Ariga et al. | 372/46.01 |
| 2010/0317132 A1* | 12/2010 | Rogers et al. | 438/27 |
| 2011/0076854 A1* | 3/2011 | Takeo | H01S 5/18313 438/745 |
| 2011/0101391 A1* | 5/2011 | Miki et al. | 257/94 |
| 2012/0018753 A1* | 1/2012 | Hao et al. | 257/94 |
| 2012/0025231 A1* | 2/2012 | Krames et al. | 257/93 |
| 2012/0068214 A1 | 3/2012 | Kuo et al. | |
| 2012/0205665 A1 | 8/2012 | Nam et al. | |
| 2013/0011656 A1* | 1/2013 | Zhang et al. | 428/312.8 |
| 2013/0050686 A1* | 2/2013 | Wunderer et al. | 356/128 |
| 2013/0134457 A1 | 5/2013 | Peng et al. | |
| 2013/0210180 A1 | 8/2013 | Wang | |
| 2013/0248911 A1* | 9/2013 | Hwang | H01L 33/10 257/98 |
| 2013/0328102 A1 | 12/2013 | Peng et al. | |
| 2013/0334555 A1* | 12/2013 | Hsieh et al. | 257/98 |
| 2014/0048830 A1 | 2/2014 | Kuo et al. | |

FOREIGN PATENT DOCUMENTS

| | | |
|---|---|---|
| JP | H10-135500 A | 5/1998 |
| JP | H11-195562 A | 7/1999 |
| JP | 2001-223165 A | 8/2001 |
| JP | 2007-518075 | 7/2007 |
| JP | 2009-067658 A | 4/2009 |
| JP | 2009239034 A | 10/2009 |
| KR | 20000038997 A | 7/2000 |
| WO | WO 2005/066612 A2 | 7/2005 |
| WO | WO 2009048265 A1 | 4/2009 |
| WO | WO 2011094391 A1 * | 8/2011 |

OTHER PUBLICATIONS

International Search Report dated Oct. 29, 2013 from corresponding International Application No. PCT/US2013/046852.
International Preliminary Report on Patentability dated Dec. 31, 2014 from corresponding International Application No. PCT/US2013/046852.
Chen, D., et al., "Nanopores in GaN by electrochemical anodization in hydrofluoric acid: formation and mechanism," *J. App. Phys.*, 112 (2012) p. 064303.
Zhang, Y. et al., "A conductivity-based selective etching for next generation GaN devices," Phys. Status Solidi B (2010) p. 1-4.
U.S. Appl. No. 14/687,814, filed Apr. 15, 2015, Han et al.
U.S. Appl. No. 13/559,199, filed Jul. 26, 2012, Zhang et al.
U.S. Appl. No. 14/929,015, filed Oct. 30, 2015, Zhang et al.
U.S. Appl. No. 14/954,195, filed Nov. 30, 2015, Han et al.
Amano et al., P-Type Conduction in Mg-Doped GaN Treated with Low-Energy Electron Beam Irradiation (LEEBI). Jpn J Appl Phys. 1989;28:L2112-4.
Bour et al., AlGaInN MQW Laser Diodes. III-V Nitride Semiconductors Applications and Devices. E.T. Yu (Ed.). Taylor and Francis Books, Inc., New York, NY, vol. 16, Chapter 10. 2003.
Bour et al., Design and performance of asymmetric waveguide nitride laser diodes. IEEE J Quantum Electron. 2000;36(2):184-191. doi: 10.1109/3.823464.
Chen et al., High reflectance membrane-based distributed Bragg reflectors for GaN photonics. Appl Phys Lett. 2012;101:221104.
Chen et al., Flexible, Compliant GaN Nanomembranes for Photonic Applications. 10$^{th}$ International Conference on Nitride Semiconductors. Abstract. Aug. 25, 2013. 2 pages.
Chung et al., Effect of Oxygen on the Activation of Mg Acceptor in GaN Epilayers Grown by Metalorganic Chemical Vapor Deposition. Jpn J Appl Phys. 2000;39(1,8):4749-50.
Dorsaz et al., Selective oxidation of AlInN layers for current confinement in III-nitride devices. Appl Phys Lett. 2005;87:072102.
Eiting et al., Growth of low resistivity p-type GaN by metal organic chemical vapour deposition. Electron Lett. Nov. 6, 1997;33(23):1987-1989. doi: 10.1049/el.19971257.
Higuchi et al., Room-Temperature CW Lasing of a GaN-Based Vertical-Cavity Surface-Emitting Laser by Current Injection. Appl Phys Express. 2008;1(12):121102. doi: 10.1143/APEX.1.121102.
Holder et al., Demonstration of nonpolar GaN-based vertical-cavity surface-emitting lasers. Proc SPIE. Mar. 13, 2013;8639:863906. doi: 10.1117/12.2008277.
Jeon et al., Investigation of Mg doping in high-Al content p-type Al x Ga 1—x N (0.3<x<0.5). Appl Phys Lett. 2005;86:082107. doi: 10.1063/1.1867565.
Jiang et al., Semiconduct or lasers: Expanding into blue and green. Nat Photon. 2011;5:521-2.
Kamiura et al., Photo-Enhanced Activation of Hydrogen-Passivated Magnesium in P-Type GaN Films. Jpn J Appl Phys. 1998;37(2,8B):L970-1.
Kasahara et al., Demonstration of Blue and Green GaN-Based Vertical-Cavity Surface-Emitting Lasers by Current Injection at Room Temperature. Appl Phys Express. 2011;4(7):072103. doi: 10.1143/APEX.4.072103.

(56) References Cited

OTHER PUBLICATIONS

Kiefer et al., Si/Ge junctions formed by nanomembrane bonding. ACS Nano. Feb. 22, 2011;5(2):1179-89. doi: 10.1021/nn103149c. Epub Jan. 19, 2011. 11 pages.

Kim et al., Reactivation of Mg acceptor in Mg-doped GaN by nitrogen plasma treatment. Appl Phys Lett. May 22, 2000;76(21):3079-81.

Kozodoy et al., Enhanced Mg doping efficiency in Al 0.2 Ga 0.8 N/GaN superlattices. Appl Phys Lett. 1999;74:3681. doi: 10.1063/1.123220.

Krishnamoorthy et al., InGaN/GaN tunnel junctions for hole injection in GaN light emitting diodes. Appl Phys Lett. Jun. 10, 2014;105(14):141104. doi: 10.1063/1.4897342. 16 pages.

Kurokawa et al., Multijunction GaInN-based solar cells using a tunnel junction. Appl Phys Express. Mar. 3, 2014;7(3):034104.1-4.

Kuwano et al., Lateral Hydrogen Diffusion at p-GaN Layers in Nitride-Based Light Emitting Diodes with Tunnel Junctions. Jpn J Appl Phys. Aug. 20, 2013;52(8S):08JK12.1-3.

Laino et al., Substrate Modes of (Al,In)GaN Semiconductor Laser Diodes on SiC and GaN Substrates. IEEE J Quantum Electron. 2007;43(1):16-24. doi: 10.1109/JQE.2006.884769.

Lin et al., Current steering effect of GaN nanoporous structure. Thin Solid Films. Nov. 2014;570(Part B):293-7.

Lu et al., CW lasing of current injection blue GaN-based vertical cavity surface emitting laser. Appl Phys Lett. 2008;92:141102.

Myers et al., Diffusion, release, and uptake of hydrogen in magnesium-doped gallium nitride: Theory and experiment. J Appl Phys. Mar. 15, 2001;89(6):3195-202.

Nagahama et al., High-Power and Long-Lifetime InGaN Multi-Quantum-Well Laser Diodes Grown on Low-Dislocation-Density GaN Substrates. Jpn J Appl Phys. 2000;39, part 2(7a):L647. doi: 10.1143/JJAP.39.L647.

Nakamura et al., Hole Compensation Mechanism of P-Type GaN Films. Jpn J Appl Phys. May 1992;31(1,5A):1258-66.

Nakamura et al., The Blue Laser Diode: The Complete Story. Springer. 2000. pp. 27, 238.

Nakayama et al., Electrical Transport Properties of p-GaN. Jpn J Appl Phys. 1996;35, Part 2(3A):L282. doi: 10.1143/JJAP.351282.

Okamoto et al., Pure Blue Laser Diodes Based on Nonpolar m-Plane Gallium Nitride with InGaN Waveguiding Layers. Jpn J Appl Phys. 2007;46:L820. doi: 10.1143/JJAP.46.L820.

Paskiewicz et al., Defect-free single-crystal SiGe: a new material from nanomembrane strain engineering. ACS Nano. Jul. 26, 2011;5(7):5814-22. doi: 10.1021/nn201547k. Epub Jun. 16, 2011.

Piprek, Blue light emitting diode exceeding 100% quantum efficiency. Phys Status Solidi RRL. Feb. 4, 2014;8(5):424-6. doi: 10.1002/pssr.201409027.

Piprek, Efficiency droop in nitride-based light-emitting diodes. Physica Status Solidi A. Oct. 2010;207(10):2217-25.

Pourhashemi et al., High-power blue laser diodes with indium tin oxide cladding on semipolar (202⁻ 1 ⁻) GaN substrates. Appl Phys Lett. 2015;106:111105.

Rogers et al., Synthesis, assembly and applications of semiconductor nanomembranes. Nature. Aug. 31, 2011;477(7362):45-53. doi: 10.1038/nature10381.

Sarzyński et al., Elimination of AlGaN epilayer cracking by spatially patterned AlN mask. Appl Phys Lett. 2006;88:121124.

Someya et al., Room temperature lasing at blue wavelengths in gallium nitride microcavities. Science. Sep. 7, 1999;285(5435):1905-6.

Tanaka et al., p-type conduction in Mg-doped GaN and Al0.08Ga0.92N grown by metalorganic vapor phase epitaxy. Appl Phys Lett. 1994;65:593. doi: 10.1063/1.112309.

Waldrip et al., Stress engineering during metalorganic chemical vapor deposition of AlGaN/GaN distributed Bragg Reflectors. Appl Phys Lett. 2001;78:3205.

Wierer et al., Comparison between blue lasers and light-emitting diodes for future solid-state lighting. Laser Photonics Rev. Nov. 2013;7(6):963-93.

Yerino et al., Shape transformation of nanoporous GaN by annealing: From buried cavities to nanomembranes. Appl Phys Lett. Jun. 2011;98(25):251910.1-3. doi: 10.1063/1.3601861.

Zhang et al., Confinement factor and absorption loss of AllnGaN based laser diodes emitting from ultraviolet to green. J Appl Phys. 2009;105:023104.

Zhang et al., Mesoporous GaN for Photonic Engineering—Highly Reflective GaN Mirrors as an Example. ACS Photonics. 2015;2(7):980-6.

Zheng et al., Synthesis of Ultra-Long and Highly Oriented Silicon Oxide Nanowires from Liquid Alloys. Adv Mater. Jan. 2002;14(2):122-4.

Zhou et al., Near ultraviolet optically pumped vertical cavity laser. Electron Lett. 2000;36:1777-9.

\* cited by examiner

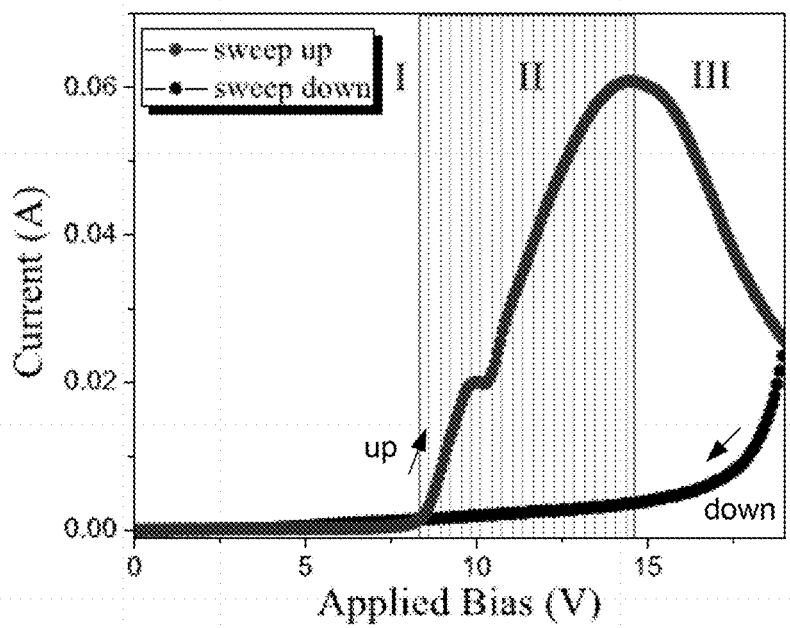
FIG. 4
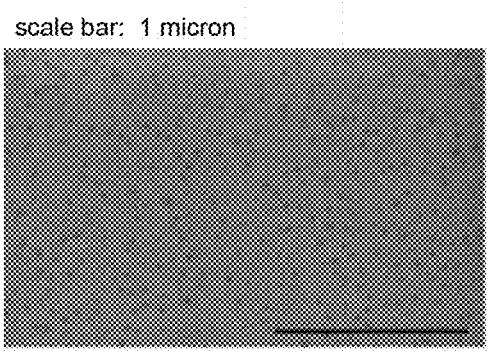
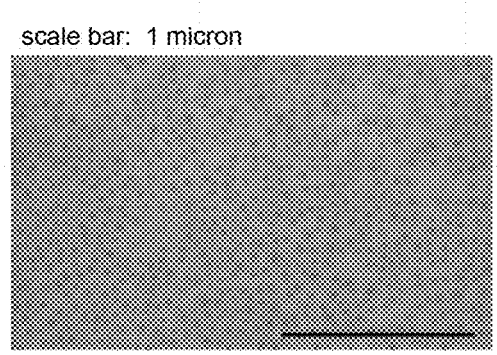
FIG. 5A  FIG. 5B

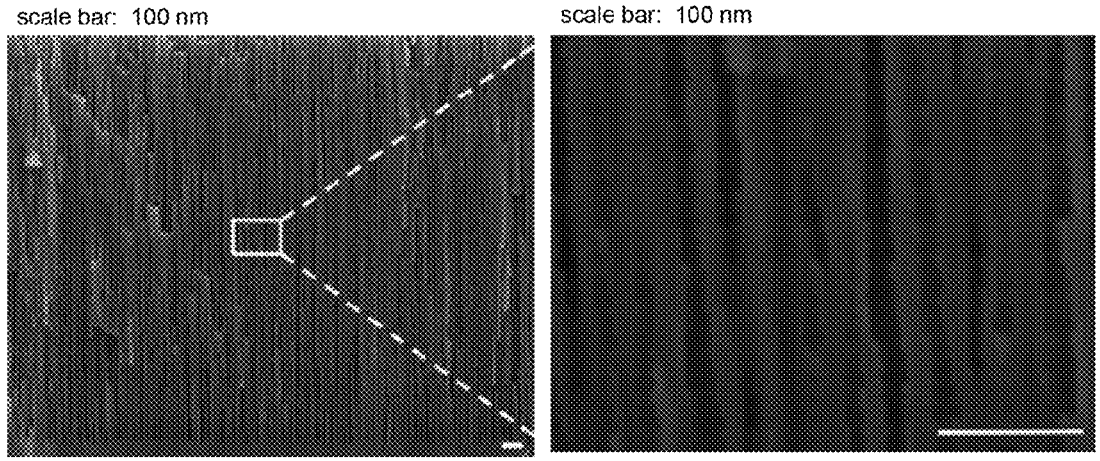
*FIG. 6A*  *FIG. 6B*
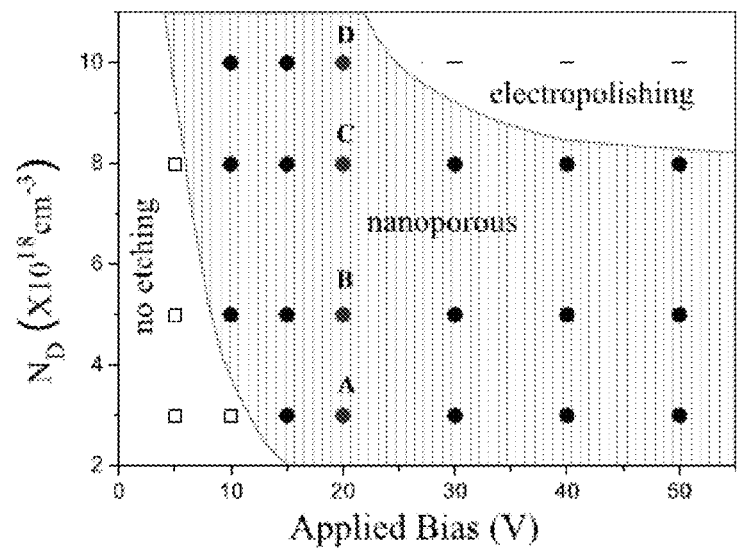
*FIG. 7*

LATERAL ELECTROCHEMICAL ETCHING OF III-NITRIDE MATERIALS FOR MICROFABRICATION

RELATED APPLICATIONS

This application claims the benefit of U.S. provisional application Ser. No. 61/665,617 titled "III-Nitride Vertical Cavity Surface Emitting Lasers (VCSEL) with GaN/air DBR by Electrochemical Etching," filed on Jun. 28, 2012, which is incorporated herein by reference in its entirety.

FEDERALLY SPONSORED RESEARCH

This invention was made with government support under DE-FG-2-07ER46387 awarded by the U.S. Department of Energy. The government has certain rights in the invention.

BACKGROUND

Technical Field

The technology relates to methods and structures for performing etching of sacrificial layers of III-nitride material. The etching techniques may be used for micro- and nano-fabrication of integrated devices, such as vertical cavity surface emitting lasers (VCSELs) based on III-nitride semiconductor material. The VCSELs may include air/semiconductor, distributed Bragg reflector (DBR) structures formed adjacent to the VCSEL using lateral, electrochemical etching techniques.

Discussion of the Related Art

The etching of semiconductor materials is an important technique that is used in microfabrication processes. Various kinds of etching recipes have been developed for many materials used in semiconductor manufacturing. For example, Si and certain oxides may be routinely etched using dry (e.g., reactive-ion etching) or wet chemical etching techniques that yield desired etch rates and etch morphologies. III-nitride materials have recently emerged as attractive materials for semiconductor manufacturing, however these materials can be chemically inert to standard wet etchants.

Some attractive applications for III-nitride materials include micro-photonic devices, such as LEDs and lasers. Some existing methods of making III-nitride VCSELs involve forming structures that comprise alternating layers of AlGaN/GaN or AlInN/GaN. However, these structures are difficult to produce and do not exhibit high refractive index contrast between the alternating layers. Accordingly, to obtain a suitable reflectivity for a laser cavity, the number of layers must be increased (e.g., to about 40) making the overall cavity thick. Additionally, it is difficult to match the cavity mode with an active layer emission wavelength. Another approach to making a VCSEL with a DBR structure is to form dielectric DBRs at two ends of the cavity using layer lift-off techniques. However, this approach is complex to implement and suffers from low yield during manufacture.

As InGaN light emitting diodes (LEDs) gradually approach technological maturity in performance for blue/green emissions, microcavity based LEDs (resonant-cavity LED, RCLED) and laser diodes (vertical-cavity surfaceemitting laser, VCSEL) become appealing alternatives that may offer advantages in enhancing radiative recombination rates, improving beam directionality, and possibly reducing the cost in manufacturing due to their planar configuration.

The encasing of the optical active region into a cavity of a few wavelengths may be done using distributed Bragg reflectors (DBRs) with minimum absorption and high reflectivity. For nitride-based emitters, top p-side DBRs may be prepared by depositing dielectric, quarter-wavelength stacks as a last step of device fabrication. The bottom (n-side) DBRs may be implemented using either dielectric stacks or epitaxially grown (Ga,Al,In)N/GaN periodic heterostructures. However, challenges still exist in both approaches toward ultimate manufacturability. The dielectric approach can require complicated thin-film lift-off and wafer bonding in order to expose the n-type GaN. For epitaxial DBRs, 20 to 40 pairs of heterostructures are needed for good peak reflectance (above 95%) due to the small contrast of refractive indices. Such a thick DBR structure causes a narrow stopband (<50 nm), creates issues in stress management on the device, and reduces the benefit of the Purcell effect.

Semiconductor/air structures have been pursued using a photo-assisted electrochemical (PEC) etch where mirrority-holes are photo-generated and confined in narrower-bandgap sacrificial layers to facilitate selective etching. Also, selective chemical etching has been identified for the AlInN/GaN system. The membrane structures prepared by the two techniques generally suffer from etched surface roughness that contributes to scattering losses in the optical devices. The maximum reflectance in the blue/green range from GaN/air DBRs, prepared by either PEC or selective wet etching, has not exceeded 75%.

SUMMARY

The described technology relates to methods and structures for lateral electrochemical etching of III-nitride materials to produce optically smooth surfaces, and for controllably forming porous III-nitride material. The etching processes are compatible with InGaN based light emitters and integrated devices. The etching techniques may be used for manufacturing various microstructures and microdevices. For example, the etching techniques may be used for making vertical cavity surface emitting lasers (VCSELs) that include distributed Bragg reflector (DBR) structures. According to some embodiments, the VCSELs and DBR structures comprise III-nitride semiconductor materials that may be deposited in multiple layers on a substrate, and the formed DBR structure comprises a limited number of alternating III-nitride/air layers. In various embodiments, the electrochemical etching of a DBR structure laterally removes alternating layers in a multilayer structure, and leaves optically smooth air/semiconductor interfaces. The electrochemical etching may be highly selective to the conductivity of the materials. The conductivity (and resulting etching properties) may be controlled by doping the materials during their deposition. By modulating the doping of epitaxial layers, highly-doped n-type layers may be laterally etched over large distances (>10 microns) in confined regions (<500 nm layer thickness sandwiched between non-etched layers) at high etch rates (>5 microns/min). The etching techniques may be used to fabricate other III-nitride devices, e.g., LEDs, high electron mobility transistors, high-power tranistors, and MEMs devices The electrochemical etching may be controlled to form optically smooth surfaces or nanoporous structures wherein the pores may have selected properties. The etching may be controlled to produce a desired etching morphology by controlling etching parameters that include one or more of:

etchant solution, electrical bias between the sample to be etched and the etchant solution, and dopant concentration of the material to be etched.

According to some embodiments, a method for laterally etching III-nitride material comprises depositing a first layer of III-nitride material having a first conductivity on a substrate, and depositing a second layer of material over the first layer. The method may further include forming a via in the second layer to expose a surface area of the first layer, and electrochemically and laterally etching at least a portion of the first layer using a hydrofluoric-based etchant. The portion of the first layer etched may undercut the second layer.

In some embodiments, a method for etching III-nitride material may comprise depositing a first layer of III-nitride material having a first conductivity on a substrate, and depositing a second layer of material adjacent the first layer. The method may further include electrochemically etching at least a portion of the first layer using a hydrofluoric-based etchant. The etched portion of the first layer may be a component of an LED device.

In some embodiments, a method for forming a distributed Bragg reflector (DBR) laser comprising III-nitride material comprises depositing a first multi-layer structure on a substrate, wherein the first multi-layer structure comprises first and second layers. The first layers may have a conductivity different than that of the second layers. The method may further include depositing a multiple quantum well (MQW) active structure adjacent the first multi-layer structure, and forming vias into the first multi-layer structure so as to provide access for an etchant to the second layers. The method for forming a distributed Bragg reflector (DBR) laser may further comprise laterally and electrochemically etching the second layers, so as to remove at least a portion of the second layers and form a DBR structure adjacent the MQW region. The DBR structure may comprise at least two first layers separated by one or more layers of air.

Structures related to the methods are also contemplated. In some implementations, a III-nitride DBR device manufactured according to the disclosed techniques may comprise a multi-layer structure having first and second layers formed of III-nitride material, wherein a conductivity of the first layers is different from a conductivity of the second layers. The device may further comprise a MQW structure formed adjacent the multi-layer structure, wherein the MQW structure comprises an active region of the device, and vias formed into the multi-layer structure proximal to the MQW structure. The DBR device may further include regions adjacent the vias in which portions of the second layers have been completely removed to form at least two first layers separated by one or more layers of air.

The foregoing and other aspects, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. The drawings are not intended to limit the scope of the present teachings in any way.

FIG. 4 depicts anodic current-voltage relationship for n-GaN etching in HF; according to some embodiments;

FIGS. 5A-5B are SEM micrographs showing a change in pore density as a function of etching time;

FIGS. 6A-6B are SEM micrographs showing synchronized pore diameter oscillation;

FIG. 7 depicts results of etching phases for varying dopant densities as a function of applied etching bias; according to some embodiments;

Figure 1:
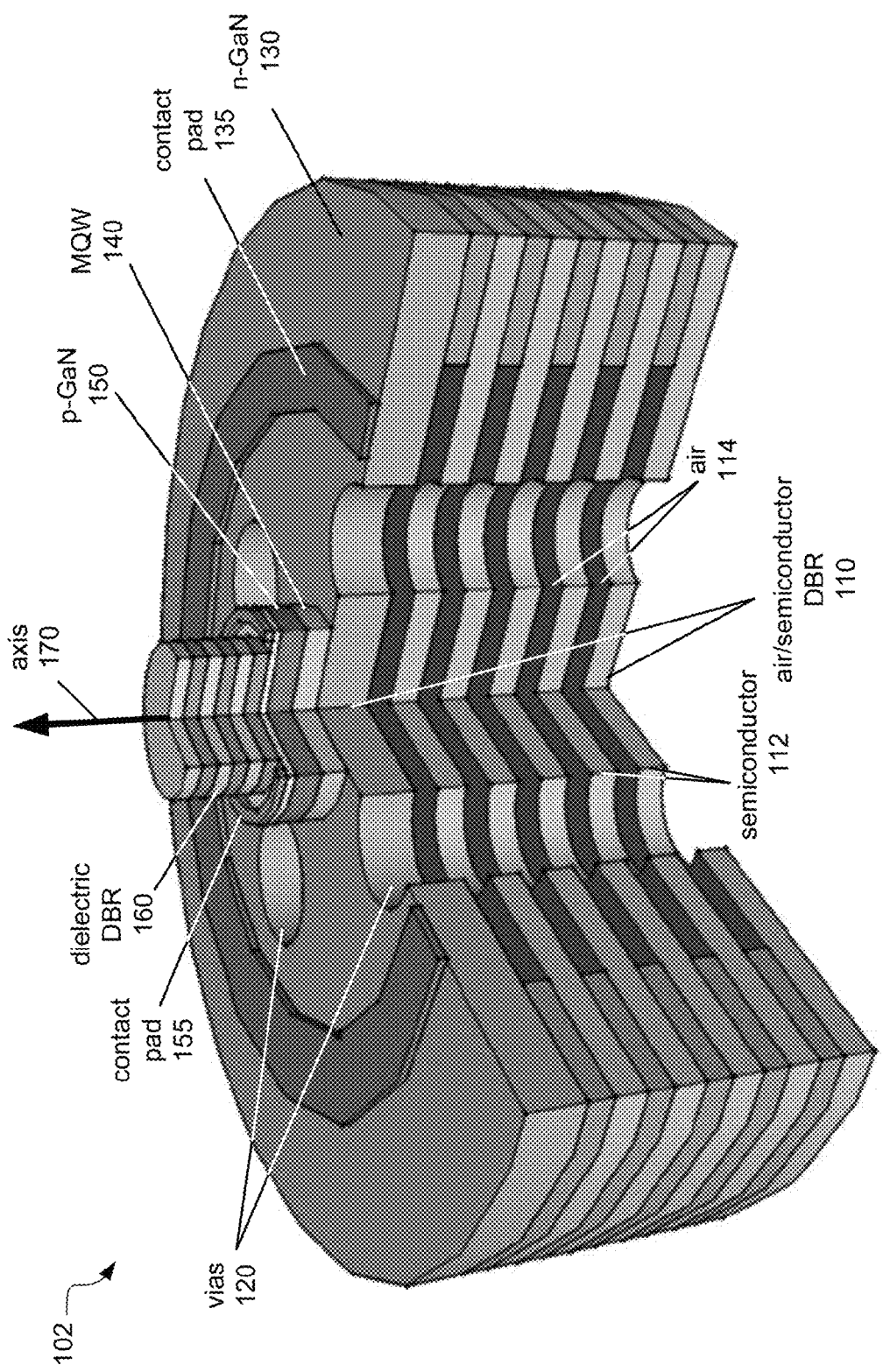
FIG. 1 depicts a III-nitride DBR laser with a MQW active region, according to some embodiments.

The features and advantages of the embodiments will become more apparent from the detailed description set forth below when taken in conjunction with the drawings.

DETAILED DESCRIPTION

Because III-nitride materials can be chemically inert to wet etchants, microfabrication of integrated optical or integrated electronic devices based on these materials poses manufacturing challenges. Although some etching techniques (e.g., dry reactive-ion etching or photochemical etching) have been developed to etch these materials, these processes can be costly and/or difficult to implement. Described herein are methods that may be used to readily etch III-nitride materials at high etch rates (e.g., at rates up to 10 microns/minute) and with uniform and controllable surface properties and etch morphologies.

The etching processes are based on electrochemical etching of III-nitride materials that have been selectively doped to tune the etching properties of the materials. The merits of conductivity-based wet etching include, but are not limited to (1) high scalability to large areas—the etching does not require UV illumination and therefore does not suffer from problems related to uniformity of illumination, (2) improved manufacturability—the electrochemical etch rate can be several orders of magnitude faster than chemical wet etch, (3) controllable etching morphology—the etching morphology may be controlled by controlling the doping profile(s) in the material(s) to be etched. For example, modulation of dopant can define complex structures in a single material.

The etching techniques may be used for various microfabrication applications, e.g., the manufacture of microstructures that include III-nitride materials. Examples of microstructures include microcavity lasers, DBR lasers, microcavity LEDs, resonant cavity LEDs, enhanced emission LEDs, transistors, and MEMs devices. In some embodiments, the electrochemical etching may be used in the preparation of highly reflective distributed Bragg reflectors (DBRs) from III-nitride materials. These DBR structures may provide a useful building block for integrated photonics, such as the manufacture of DBR lasers, microcavity structures, and enhanced emission structures. Other devices fabricated from III-nitrides may comprise detectors and emitters in the blue/green region of the optical spectrum, as well as transistors that may be used in high power and/or high electron mobility devices. For integrated optical applications, an integrated DBR structure may be used to provide tailored reflectance or transmission bands for integrated photonic structures.

Research on porous semiconductors has drawn much attention, since the discovery of intense luminescence from porous silicon. The creation of nanopores through electrochemical (EC) anodization transforms conventional semiconductors into three-dimensional meshed networks or foams that are inherently single crystalline. Applications of porous III-V semiconductors in microelectronics, optics, sensing, and light harvesting have been demonstrated. Extension of the porosification study to wide-bandgap GaN is especially appealing due to its demonstrated importance in light emitting diodes and high power electronics. GaN is chemically inert with no available wet etching process at room temperature. Accordingly, an electrochemical etching process for III-nitride materials will have attractive technological implications.

GaN epilayers are typically prepared with a high density of dislocations. Porous GaN can conceivably influence and block the propagation of dislocations. Additionally, it has been shown that the surface states of GaN tend to have a much slower recombination velocity than those from conventional As- and P-based III-V compounds, making it possible to consider the usage of porous GaN as an active medium.

By way of explanation, methods for making integrated DBR structures for integrated photonic devices are described below to exemplify how the etching techniques may be used to form advanced integrated optical structures. However, the invention is not limited to the formation of DBR structures for VCSELs only. The etching techniques may be applied to other microfabrication processes involving III-nitride materials. For example, the etching techniques may be used to form LEDs, transistors, cantilevers, or microelectromechanical structures based on III-nitride materials. In some embodiments, the etching techniques may be used to form thin membranes. In some implementations, the etching techniques may be used to release membranes or devices from a substrate.

FIG. 1 shows one example of an integrated photonic DBR laser 102 that includes a highly reflective DBR structure 110 that may be fabricated using electrochemical etching of sacrificial III-nitride layers. The highly reflective DBR structure 110 may form a wavelength-selective mirror at a first end of a cavity of the DBR laser 102. The active or gain region of the laser may comprise a multiple quantum well (MQW) structure 140. The MQW 140 may be sandwiched between a layer of n-type semiconductor material 130, which may inject electrons into the MQW region, and a p-type semiconductor material 150, which may inject holes into the MQW region. The holes and electrons may recombine in the MQW region to produce photons. There may be a first contact pad 135 formed on the n-type semiconductor material 130 and a second contact pad 155 formed on the p-type semiconductor material 150.

In some embodiments, a second end of the DBR laser cavity may comprise a dielectric DBR structure 160 that functions as a wavelength-selective mirror. In other embodiments, a dielectric DBR structure may not be used, and a reflective or semi-reflective layer of material (e.g., a thin film of metal such as silver, chrome, or gold) may be deposited at the second end of the laser cavity. The reflectivity of the dielectric DBR 160 or deposited material may be less that the reflectivity of the highly reflective DBR 110, such that the majority of light from the laser emits from the second end of the cavity along the optical axis 170, as depicted in the drawing.

In the depicted embodiment, the highly reflective DBR structure 110 comprises an air/semiconductor multilayer stack. The semiconductor may be a III-nitride semiconductor (e.g., GaN, InGaN, InAlGaN). According to various embodiments, the layers of semiconductor 112 are separated by layers of air 114. According to some embodiments, the layers of air may be continuous and uniform where the sacrificial layers have been removed, e.g., there are no remnants of the sacrificial layer protruding into the air layers. In some embodiments, the regions shown as air layers may comprise highly porous sacrificial material, e.g., the regions may contain a sparse density of filaments remaining from the sacrificial layer. The structure may further include vias 120, which may be formed for etching purposes, as described further below.

FIGS. 2A-2G outline methods that may be used to fabricate a structure like that shown in FIG. 1. For brevity, not all fabrication steps are shown in the drawings. Steps omitted as not being necessary for understanding the methods will be readily deduced by those skilled in the art of microfabrication. According to some embodiments, a method for fabricating an integrated photonic device (e.g., a DBR laser) with a highly reflective DBR structure may comprise preparing or obtaining a substrate 205 with a multi-layer stack 210 of III-nitride semiconductor material formed on the substrate. The substrate may be any suitable substrate, e.g., a semiconductor, a glass, crystalline material, a ceramic, a polymer. In some embodiments, the substrate 205 may be formed from sapphire.

The stack 210 may comprise alternating layers of III-nitride material, wherein first layers 211 have a different electrical conductivity than second layers 213. The III-nitride materials may comprise (Ga,Al,In)N materials where the constituents may be present in any III-nitride combination. In some embodiments, the stack 210 may comprise (Ga,Al,In)N/GaN periodic heterostructures. In some implementations, any one layer may comprise $Al_xIn_yGa_{1-x-y}$ N where x and y may range between 0 and 1 in a manner such that $0 \leq 1-x-y \leq 1$. The layers may be deposited by one or a combination of deposition techniques, e.g., chemical vapor deposition (CVD), plasma enhanced CVD (PECVD), metal organic CVD (MOCVD), hydride vapor phase epitaxy (HVPE), molecular beam epitaxy (MBE) or atomic layer deposition (ALD), according to some embodiments. The first and second layers may alternate in the stack, as depicted, according to some embodiments. In other embodiments, the first and second layers may be arranged in other orders within the stack, or there may be only two layers present. In some embodiments, additional layers may be deposited that may comprise materials other than III-nitrides.

The thicknesses of the layers 211, 213 may be selected to satisfy optical design parameters for a DBR structure, according to some embodiments. For example, the thicknesses of the first layers 211 may be approximately one-quarter and/or three-quarter of a selected emission wavelength from the laser. In some embodiments, all first layers may have approximately the same thickness. In other embodiments, at least one of the first layers 215 may have a thickness different than other first layers. The thicknesses of the layers 211, 213 may be between approximately 50 nm and approximately 500 nm.

Some of the layers, e.g., second layers 213, may be designated as sacrificial layers. These sacrificial layers may be removed in whole, or in part, during an etching step. The conductivity, or dopant concentration, of the sacrificial layers may be selected such that these layers will etch at a significantly higher rate than the first layers 211. In some embodiments, the dopant concentration of the sacrificial layers may be selected such that these layers etch so as to provide a particular morphology.

During deposition, a dopant may be added to yield a selected conductivity of the layers. For example, the second layers 213 may be doped with an n-type dopant (e.g., Si) at a dopant concentration between approximately $10^{17}$ to approximately $10^{20}$ cm$^{-3}$. The inventors have found that electrochemical etching of n-type III-nitride material in HF-based etchants can occur at high etch rates (e.g., greater than 10 microns/minute) for materials doped in this range. Additionally, the etched surface can exhibit high smoothness that may be beneficial for photonic devices, or the etched material may be made porous, depending on the selected etching conditions. The first layers 211 may be lightly doped as n-type material, in some embodiments, or may be undoped in other embodiments. Modulation of the doping in the multi-layer stack can define the etchant profiles and morphologies.

According to some embodiments, an additional layer (a ground layer, not shown) may be deposited proximal to the multi-layer stack 210. The ground layer may comprise a conductive layer formed from doped III-nitride material or other conductive material. The ground layer may provide uniform current spreading for an electrochemical etching process. For example, a potential bias or reference potential may be applied to the ground layer during electrochemical etching, and the ground layer may aid in uniformly spreading the electric field across the region to be etched.

Figure 2A:
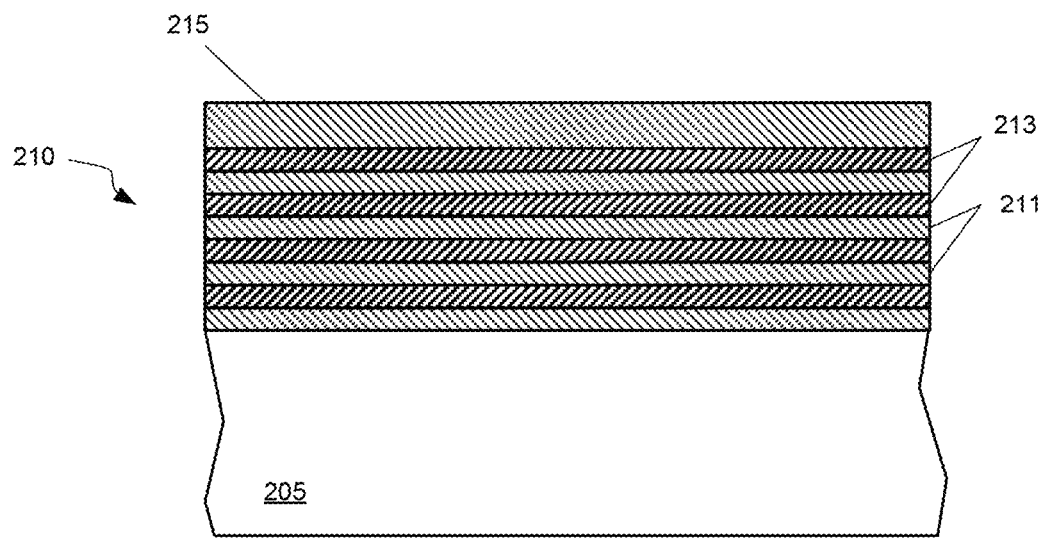
FIGS. 2A-2H depict methods for fabricating structures that include laterally-etched III-nitride materials, according to some embodiments.
Figure 2B:
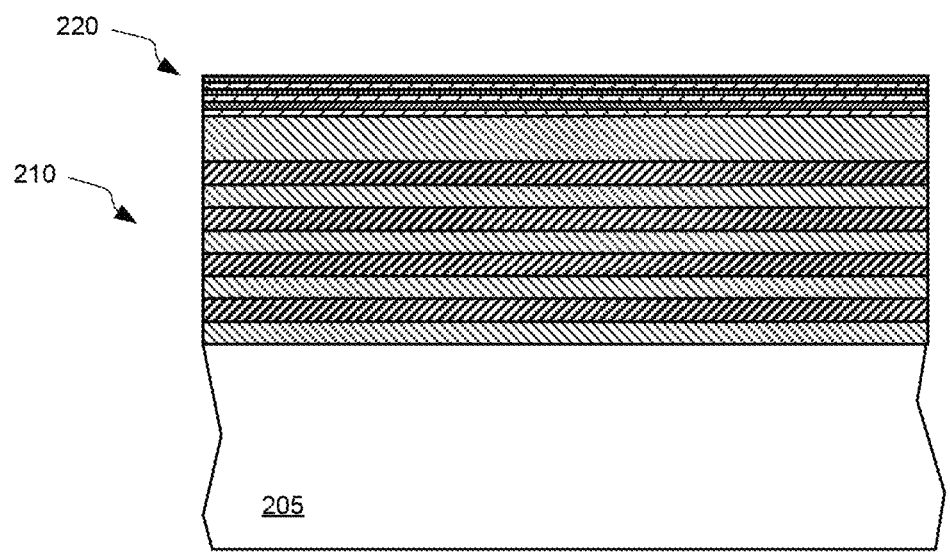

With reference to FIG. 2B, active layers 220 for a laser or LED may be formed adjacent the multi-layer stack 210. In some embodiments, the active layers 220 may form a multiple quantum well (MQW) structure or a superlattice (SL). The active layers may comprise multiple layers of semiconductor materials, e.g., layers of III-nitride materials. Additional layers of other materials, e.g., insulators, metals, polymers, may be included with the active layers in some implementations.

Figure 2C:
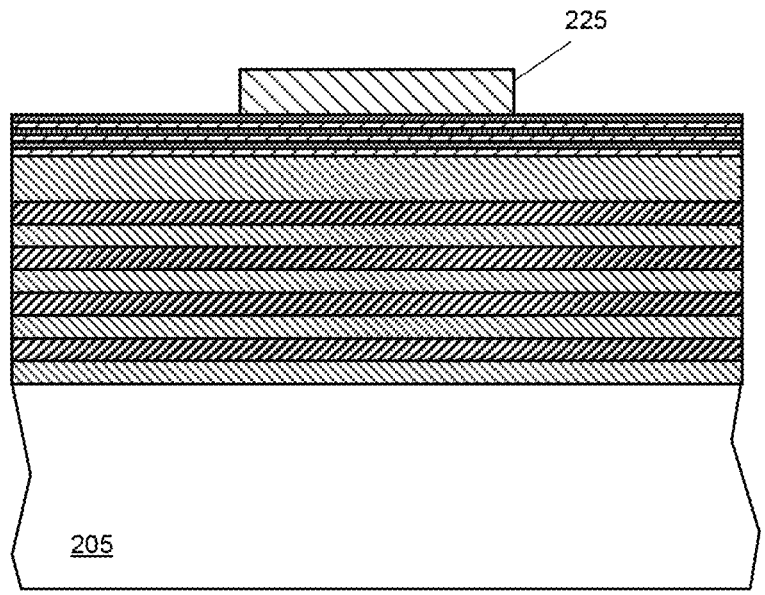
Figure 2D:
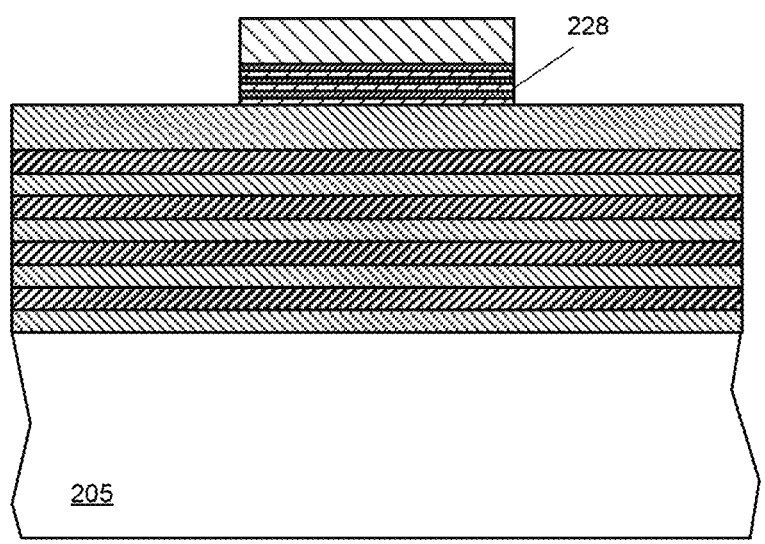

The active layers 220 may be patterned using lithography and etching techniques, as depicted in FIGS. 2C-2D. A resist may be applied uniformly over the active layers 220, and subsequently patterned, e.g., via photolithography, to provide a resist mask 225. The exposed regions of the active layers 220 may be etched away using an anisotropic dry etching process, e.g., reactive ion etching, to form an active MQW region 228 of a device.

Figure 2E:
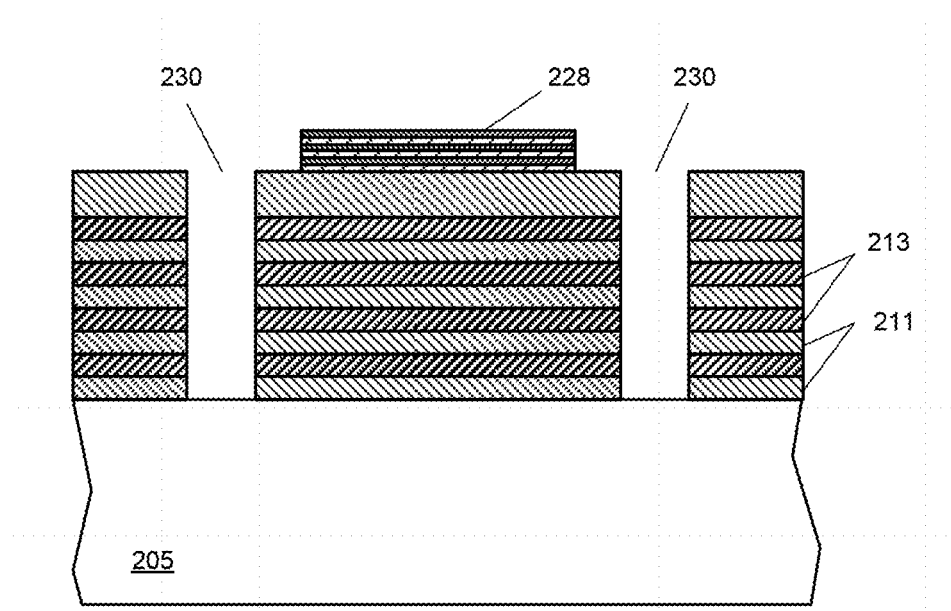

The resist mask 225 may be stripped from the substrate, and another resist mask formed to define vias 230 in the multi-layer stack 210, as depicted in FIG. 2E. The vias may be proximal the active region 228, and may be formed using a dry anisotropic etch process. There may be multiple vias around the active region, as depicted in FIG. 1 for example, and the vias may or may not be circular in cross section. The vias 230 along their sidewalls may expose surface regions of the first and second layers 211, 213. The resist may be stripped from the substrate to yield the structure shown in FIG. 2E.

After formation of the vias, the substrate and multi-layer stack 210 may be subjected to electrochemical etching in an HF-based etchant. The etching may take place in an etchant bath, wherein a potential bias is applied between the etchant solution and the multi-layer stack. Arrangements for etching may include those described in U.S. patent application Ser. No. 13/559,199 filed Jul. 26, 2012, which is incorporated herein by reference in its entirety. The applied bias may be between approximately 5V and approximately 60V, according to some embodiments. In some embodiments, the applied bias may be controllably varied during the etching steps, for example as described in "Nanopores in GaN by electrochemical anodization in hydrofluoric acid: formation and mechanism," by D. Chen et al., *J. App. Phys.*, 112 (2012) p. 064303, which is incorporated herein by reference in its entirety.

According to some embodiments, the HF-based etchant may be substantially non-aqueous. The inventors have found that an aqueous solution of HF can contribute to a swelling, deformation, or increased stress of the remaining, unetched layers. In some implementations, an HF/ethanol etchant solution may be used, in which any water content is minimized in the etchant to less than about 10%.

In some implementations, the HF may be aqueous, e.g., ~50% in water, which is then diluted with ethanol and/or glycerol. In some cases, the volume ratio of ethanol to HF (~50%) may be between approximately 0.5:1 and approximately 9:1. In some embodiments, the water content of the etchant may be reduced by adding ethanol and/or glycerol to between 5% and 15%.

The inventors have also found that adding glycerol to the HF/ethanol etchant can improve lateral etching rates and smoothness of the etched surfaces. In some embodiments, the etchant comprises ethanol/glycerol added to HF acid. According to some embodiments, the etchant may comprise ~10% HF, ~10% water, ~32% ethanol, and ~48% glycerol, where the percentages refer to volume. In some embodiments, these percentages may be varied by up to ±5% from the values listed. In other embodiments, these percentages may be varied by ±5% or more from the values listed. The etching may be carried out at room temperature, in some embodiments. In some implementations, the etching may be carried out between approximately 10° C. and approximately 40° C. The bias applied during the electrochemical etching may be between approximately 10V and approximately 30V, in some implementations. The dopant concentration may be between approximately $1\times10^{19}$ cm$^{-3}$ and approximately $5\times10^{19}$ cm$^{-3}$, in some cases. In some embodiments, the dopant concentration may be between approximately $3\times10^{18}$ cm$^{-3}$ and approximately $2\times10^{19}$ cm$^{-3}$. With these etchant parameters, lateral etch rates of between about 2 microns/min and about 10 microns/minute may be achieved. According to some embodiments, etching rates in this range can be achieved in closed-space configurations (approximately 200 nm layer separation). The etching may yield surface smoothness of approximately 5 nm RMS over an etched area of 25 square microns.

If porous GaN is desired, other etching parameters may be used. Parameters for forming porous GaN are discussed below in connection with Example 1. Porous GaN may be used for the manufacture of III-nitride LEDs. In some embodiments, a DBR structure may be formed using highly porous GaN intermediate layers in the DBR stack. The highly porous layers may provide significant refractive index contrast and also provide support for uniform spacing of the unetched DBR layers.

Figure 2F:
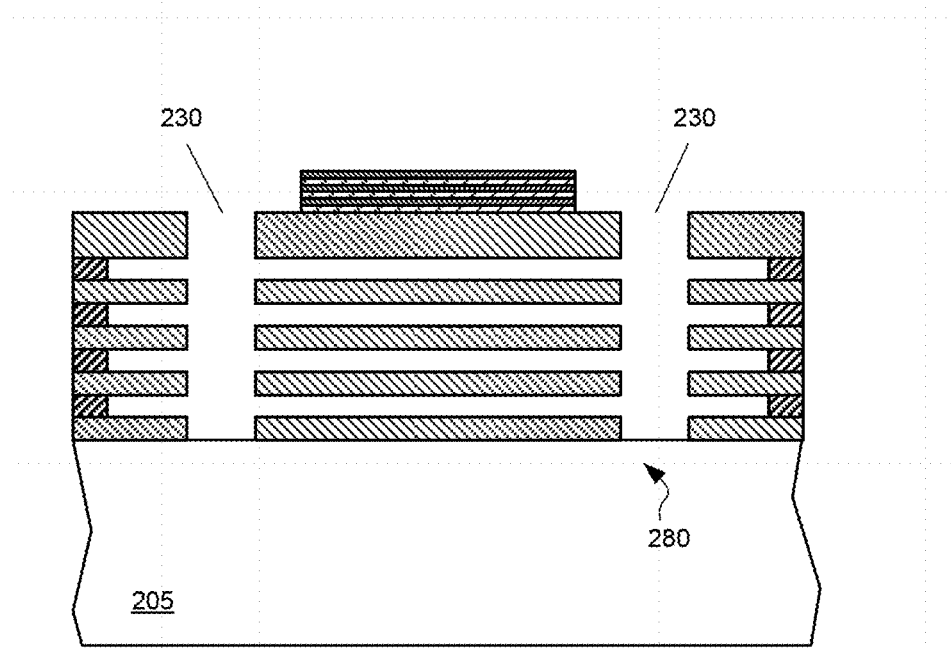

As a result of electrochemical etching and removal of the second layers 213, a DBR structure 280 as depicted in FIG. 2F may be formed. The lateral etching may remove portions of the second layers to form continuous layers of air between layers of semiconductor. With the layer thicknesses chosen to be approximately one-quarter of a target emission wavelength, the DBR structure can provide high reflectivity (e.g., >70%) over a wide wavelength band (e.g., ~150 nm) with six or fewer semiconductor layers. According to some embodiments, a peak reflectance of more than 98% may be achieved with as few as four semiconductor layers.

Figure 2G:
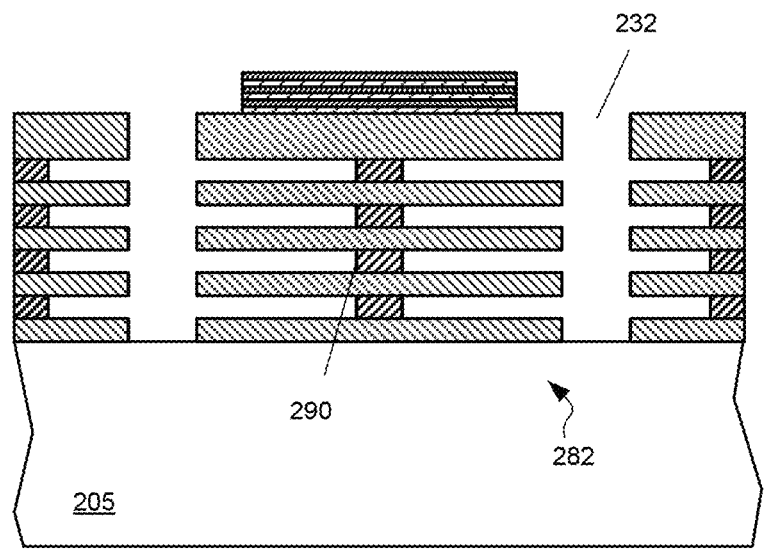

FIG. 2G depicts another embodiment of a DBR structure 282 formed adjacent an active MQW region. In this embodiment, the sacrificial layers are not completely removed beneath the MQW structure. A pillar 290 may remain to provide uniform spacing of the first, unetched layers. The pillar may be sub-wavelength in cross-sectional dimension in some embodiments, and may or may not be circular in cross section. In some embodiments, the pillar 290 may have a cross-section that is approximately as wide as the MQW active region. In some embodiments where a pillar 290 is formed, the via 232 may comprise an annular ring surrounding the MQW region. The discs of the first layer material formed by etching may be supported entirely by the pillar structure.

Figure 2H:
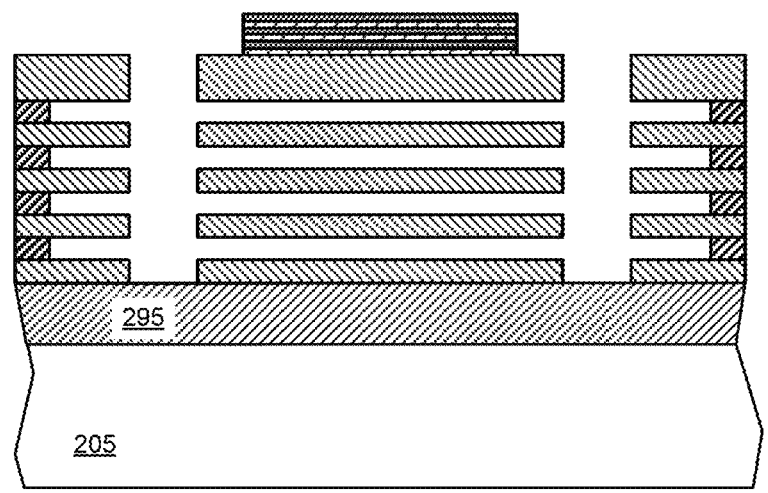

The inventors have found that stresses in the unetched layers 211 can lead to warping, buckling, or out-of-plane deformations when the sacrificial layers 213 are removed. A structure shown in FIG. 2G may mitigate out-of-plane deformations. In other embodiments, one or more stress-compensating layers 295 may be deposited proximal the etched regions, as depicted in FIG. 2H. The stress compensating layer 295 or layers may impart a stress opposite to that of the unetched first layers 211 to the etched region, and thereby compensate for the stresses of the first layers 211. In some implementations, stress compensating layers may be included as multiple thin layers in the multi-layer stack 210, e.g., each adjacent the a respective first layer.

A DBR laser cavity may be completed by capping the MQW structure with a dielectric DBR structure (as depicted in FIG. 1) or a reflective material, e.g., a thin metallic film such as a layer of silver. The dielectric DBR or reflective material may be deposited after the active layers 220, and may be patterned before or at the same time as the patterning of the MQW region. According to some embodiments, a second mirror for the cavity may be formed using techniques developed for the manufacture of LEDs.

Electrochemical etching techniques may also be employed during the fabrication of LED devices. For example, an air/semiconductor DBR structure as described above may be formed adjacent a planar III-nitride LED to reflect emission from a substrate to a direction away from the substrate, e.g., towards a viewer. In some implementations, air/semiconductor DBR structures may be formed adjacent an LED to make resonant cavity and/or microcavity LED emitters. The DBR structures may enhance emission from the LEDs. Additionally or alternatively, a portion of the LED device may be made porous using electrochemical etching. Porosification of the LED may enhance photon emission from the devices active region. Selection and control of pore morphology, as described in the following example, may improve LED emissions.

EXAMPLES

Example 1

Controlled Porosification of GaN

This example describes the use of hydrofluoric acid (HF) as a versatile electrolyte for preparing porous GaN with a wide range of morphology from curved to highly parallel pores. The interplay among different electro-chemical processes may be elucidated using cyclic voltammetry. Under suitable conditions, a record-high rate of porosification (up to 150 μm/min) is observed. The influence of electrolyte concentration, sample conductivity (doping), and anodization potential is investigated. The rich variety of pore morphology can be explained by a depletion-region model where the available current flow pathways in GaN, determined by the ratio of inter-pore spacing and the width of depletion region, define the directions of pore propagation and branching.

Figure 3B:
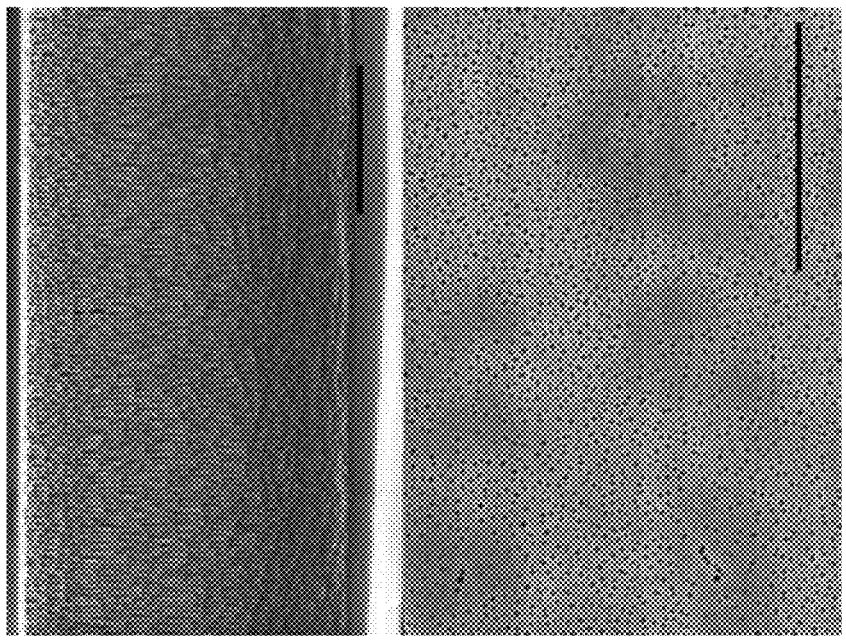
FIG. 3A-3B are SEM micrographs of nanoporous GaN formed by electrochemical etching in HF-based etchant, according to some embodiments.
Figure 3A:
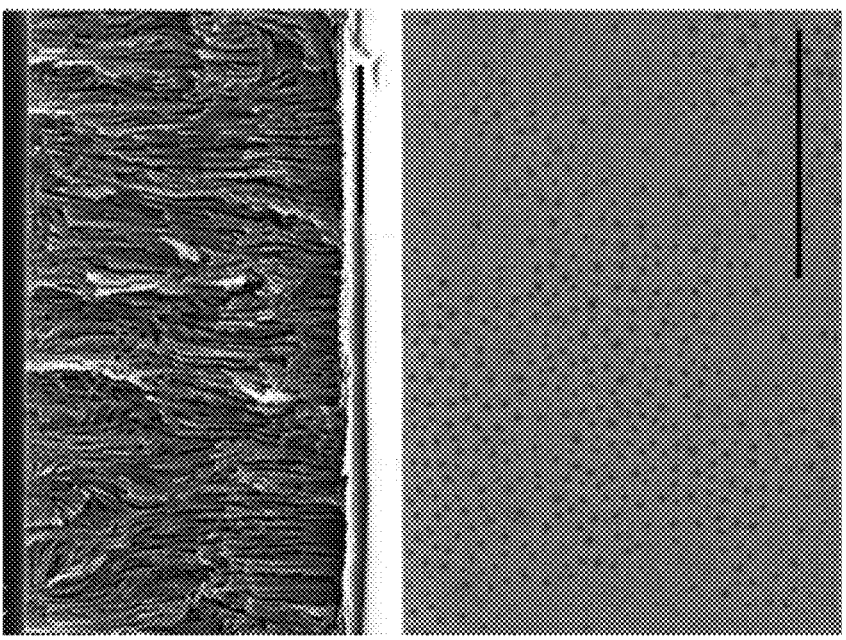

Electrochemical porosification experiments were conducted in a two-electrode cell at room temperature with n-type GaN as the anode and a platinum wire as the counter electrode (cathode). Ga-polar Si doped GaN of 2 μm thickness was grown on c-plane sapphire by metal-organic chemical vapor deposition (MOCVD) with a doping range of $10^{17}$-$10^{19}$ cm$^{-3}$ and defect density range $10^8$-$10^9$ cm$^{-2}$. Underneath the Si-doped layer, an undoped GaN layer of 500 nm was used as an etch stop. An n-GaN layer ($5\times10^{18}$ cm$^{-3}$) with a thickness of 500 nm was grown prior to the etch stop and contacted with conductive tape to ensure uniform distribution of the anodization bias across the sample (~1×1 cm$^2$). The electrolytes were prepared by adding ethanol to HF (49%) with a volume ratio from 0.5:1 to 9:1. The anodization process was carried out in a potentiostatic (constant voltage) mode controlled by a Keithley 2400 source meter, while etching current is recorded under room light without UV illumination. After anodization, samples were rinsed with deionized (DI) water and dried in $N_2$. Scanning electron microscopy (Hitachi SU-70) was used to study the pore morphology. Representative cross-section and plan-view images of GaN are shown in FIGS. 3A-3B. In the cyclic voltammetry experiment, the source meter is programmed to provide a constant sweep rate of 6 V/s. The scale bars for these SEM images is 1 µm. For the sample shown in FIG. 3A, the bias was 8V. For the sample shown in FIG. 3B, the bias was 18V.

The morphology of porous textures and patterns may be determined by the highly inhomogeneous etching process, which consists of successive steps including carrier transport in the space-charge (SC) layer, oxidation at the semiconductor surface, transport of ions in the oxide layer (OL), field-enhanced dissolution of oxide at the oxide-electrolyte interface, and ionic transport within the interfacial double layer (DL). The local electric field within each layer plays a role in regulating or facilitating the aforementioned process. The richness in porous morphology is derived from (1) the curvature-driven electrochemical etching due to the concentration of electric field near surface undulations/defects, with a statistical nature not dissimilar to nucleation, and (2) the competing dynamics in the growth and dissolution of intermediate oxide, resulting in different distributions of electric field in SC, OL, and DL layers, which can alter the rate-limiting steps in the EC etching and the final morphology. To gain insight into the underlying redox process over a wide range of anodization potential, cyclic voltammetry (or voltammogram) was performed.

FIG. 4 shows a typical cyclic current-voltage (CV) characteristic for n-type GaN in aqueous HF ($N_D$=8×10$^{18}$ cm$^{-3}$, [HF]=25%). In the forward direction, three regions with different CV slopes are distinguished, reflecting differences in the underlying rate-limiting steps. Region I corresponds to low bias, pre-breakdown conditions. Leakage current across the reverse-biased electrolyte/n-GaN junction is responsible for the etching and the formation of surface pits (see FIG. 5A). Surface pits formed under region I do not propagate into GaN layers to become nanopores due to a lack of a consistent supply of holes from thermalization only. This region is subsequently denoted as "no etching."

The stochastic nature of such an etching mechanism is manifested by a linear increase of pit density with etching time, as seen in the SEM images of FIGS. 5A-5B. The n-type dopant density for this sample was 1.2×10$^{19}$ cm$^{-3}$, and the sample was etched in 25% HF for 10 min (FIG. 5A) and 25 min (FIG. 5B). The corresponding surface pore densities were found to be 9.5×10$^9$ cm$^{-2}$ (FIG. 5A) and 2.0×10$^{10}$ cm$^{-2}$ (FIG. 5B).

In region II, the electric field is sufficient to induce local breakdown in reverse biased GaN, providing holes for the redox reaction and etching. Porous GaN can be formed consistently in this region, and the process is rate-limited by carrier transport (SC). The appearance of multiple current peaks in this region implies the emergence of a multi-step redox reaction involving intermediate oxidation states. At the onset of pore formation, (structural) defect-assisted etching prevails such that the pore density remains unchanged during etching and comparable to the dislocation density. Increasing the anodization bias beyond the first oxidation peak (~10 V), an additional dissolution process emerges that causes the etching front to propagate very rapidly. An etch rate as high as 2.5 µm/s has been obtained under a bias of 20V ($N_D$=8×10$^{18}$ cm$^{-3}$, [HF]=25%). This etch rate is one to two orders of magnitude faster than previously reported results. When the static anodic potential is between the first and second oxidation peaks, synchronized oscillations in pore diameter with a spatial coherence over tens of microns were observed, as shown in FIG. 6. Such a phenomenon has been observed in other III-V system and has been explained by a "current burst" model. According to this model, the self-induced oscillation is attributed to the formation and dissolution of an intermediate OL, causing a dynamic modulation of resistance, current, and consequently the pore diameter.

In region III, the dissolution of oxide occurs homogeneously across all GaN/electrolyte interfaces, and electropolishing rather than porosification is observed. The decrease of current with an increasing bias is due to the depletion of ions near the interface and the corresponding increase in the thickness of the diffusive layer (also known as Guoy layer). The redox process in region III may then be limited by ion diffusion (DL). The asymmetry in the up-sweep and down-sweep traces (i.e., the absence of reduction peaks) suggests that the reverse electron transfer rate is negligible, unlike the conventional cases with metallic anodes, and indicates the porosification process of GaN is irreversible.

A wide variety of pore morphologies can be created in GaN by electrochemical etching with HF. The effects of doping level and electrolyte concentration are discussed below. N-GaN with four different doping levels (3×10$^{18}$ cm$^{-3}$, 5×10$^{18}$ cm$^{-3}$, 8×10$^{18}$ cm$^{-3}$, and 1.2×10$^{19}$ cm$^{-3}$) were anodized in 25% HF with an applied bias ranging from 5V to 50 V. FIG. 7 summarizes the phase diagram of the observed morphology, consisting of mainly no etching, nanoporous etching, and electro-polishing regions. (These three regions are delineated by solid lines as a visual guide.)

Within the nanoporous region, the doping level has a profound effect on the pore morphology, as shown in FIGS. 8A-8D. These SEM images show cross-sectional and plan-view (inset) images of samples having different doping levels. The doping levels were: sample A, $N_D$=3×10$^{18}$ cm$^{-3}$, sample B $N_D$=5×10$^{18}$ cm$^{-3}$, sample C $N_D$=8×10$^{18}$ cm$^{-3}$, and sample D $N_D$=1.2×10$^{19}$ cm$^{-3}$. All samples were etched in 25% HF at 20 V.

Figure 9:
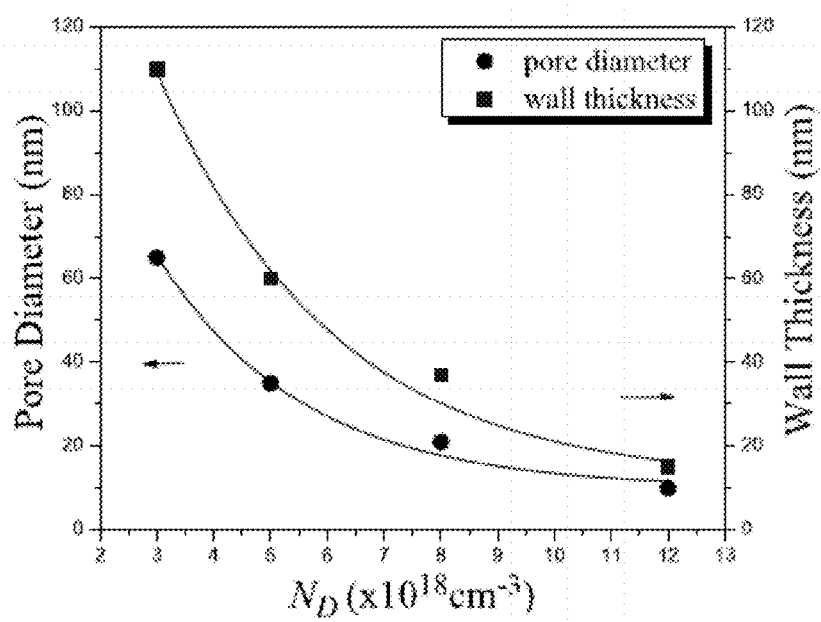
FIG. 9 plots pore diameter and wall thickness as a function of dopant density, according to some embodiments.

Under same etching conditions, an increase in doping, corresponding to an upward move in FIG. 7, results in (i) an increase in pore density, (ii) a decrease in pore diameter, and (iii) the pores being from horizontal/tree-branch-like to highly vertically aligned. The trends of (i) and (ii) are summarized quantitatively in FIG. 9. The dopant used for the results of FIG. 7 and FIG. 9 was silicon. The samples were etched in 25% HF.

Figure 10:
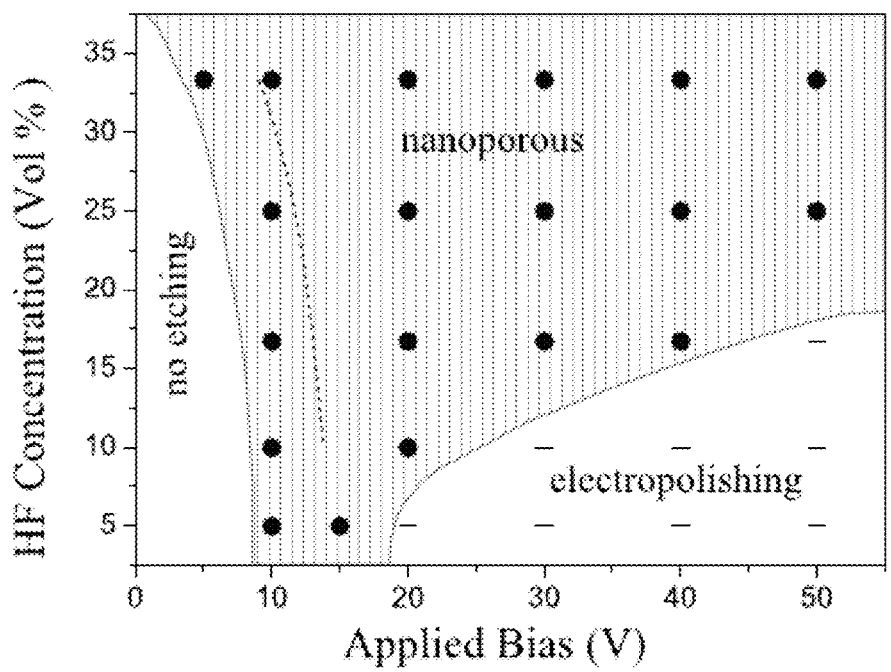
FIG. 10 depicts results of etching phases for varying HF concentration as a function of applied etching bias; according to some embodiments.

Keeping the doping level constant, we have investigated the effects of electrolyte concentration using HF:ethanol mixtures. Again, three regions are mapped out in FIG. 10 in a manner similar to the doping-bias study in FIG. 7. Additionally, a dashed line is used to delineate the observed first oxidation peak extracted from voltammetry. Two notable trends were observed as the HF concentration increases: (1) a decrease in the breakdown potential and the first oxidation potential, and (2) the delayed onset for electropolishing to occur or the widening of the window for porous etching. As the HF concentration increases (to no more than 35%), the ion concentration in Helmholtz and diffusive layers increases, the effective capacitance increases, and the voltage drop in the electrolyte decreases, giving rise to an apparent reduction in the breakdown potential (the boundary between no-etching and porous regions in FIG. 10) and the first oxidation peak. Under a higher anodization bias, on the other hand, a higher HF concentration increases the oxide dissolution rate, making it less likely for oxide-induced, homogeneous electropolishing to take place, effectively broadening the window of the porous region.

Figure 11:
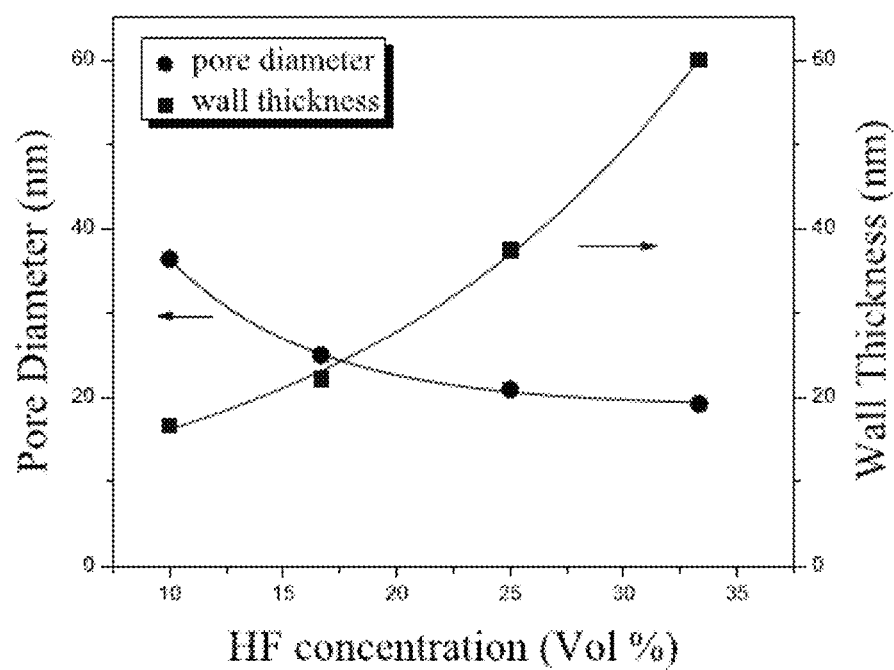
FIG. 11 plots pore diameter and wall thickness as a function of HF concentration, according to some embodiments.

The graph shown in FIG. 11 plots the geometric parameters (pore diameter and wall thickness) at various HF concentrations, which shows that high HF concentration produces smaller pores with thicker sidewalls. A high HF concentration can be used to fine tune the structure of the pores, while a low HF concentration is more effective in electropolishing GaN surfaces. Electropolishing of GaN to produce optically smooth surfaces may be between HF concentrations of about 5% and 15%, in some embodiments. For the data of FIG. 11, the n-GaN was doped at $N_D \sim 8 \times 10^{18}$ cm$^{-3}$ and etched at 20 V.

Several models have been developed for the variations in pore morphology in Si and other III-V semiconductor materials. The depletion layer model treats porous media as a reverse-biased Schottky diode and explains the morphology by the curvature-induced concentration of the electric field. Lehmann and Gösele proposed a quantum wire model to explain the difficulties in hole transport for micropores (diameters from below 2 nm to 20 nm). The rates of carrier transport in Si and mass transport in the electrolyte are thought to be responsible for the observed fractal morphology of macropores in the diffusion limited model. Additionally, as has been briefly described in FIG. 6, the oscillation in pore diameters has been attributed to current burst.

Based on the above findings, ion diffusion does not appear to be a rate limiting step once the HF electrolyte exceeds a certain concentration. The porous morphology in the majority of region II depends on the availability of mirrority carriers (holes) created by impact ionization. The trajectory of the pore can be considered as a mapping of the electric field/carrier flow contours. The possible current flowing pathway is determined by the inter-pore spacing $d_w$, and the thickness of space charge region $d_{sc}$. The measured $d_w$ and calculated $d_{sc}$ are listed in Table I for the four samples of different doping levels. Correlating Table I with the observed morphologies (FIGS. 8A-8D), a consistent model emerges where the pore morphology is determined by the presence and pinch-off of the conduction paths in-between pores, quantifiable in terms of a ratio $d_w/d_{sc}$.

TABLE I

Comparison of space charge region thickness and pore separation in samples A-D, etched in 25% HF at 20 V.

| Sample[a] | $N_D$ ($\times 10^{18}$ cm$^{-3}$) | $d_w$ (nm)[b] | $d_{sc}$ (nm)[c] | $d_w$:$d_{sc}$ |
|---|---|---|---|---|
| A | 3 | 175 | 81.5 | 2.15 |
| B | 5 | 95 | 63.1 | 1.51 |
| C | 8 | 58 | 50.1 | 1.16 |
| D | 12 | 25 | 40.7 | 0.61 |

[a]Corresponds to samples in FIG. 5 and FIG. 6
[b]$d_w$ is deduced from the diameter and wall thickness of pores.
[c]$d_{sc} = \sqrt{2\epsilon\epsilon_0 U_{sc}/(qN_D)}$, where $\epsilon$ is the dielectric constant, $\epsilon_0$ is the permittivity of GaN, $U_{sc}$ is the drop across the depletion region (deduced from reference electrode), q is the charge of an electron, and $N_D$ is the donor density.

Figure 8A:
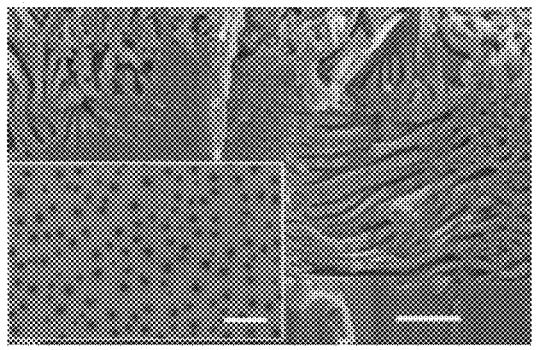
FIGS. 8A-8D are SEM micrographs illustrating different pore morphologies as a function of dopant density.
Figure 8B:
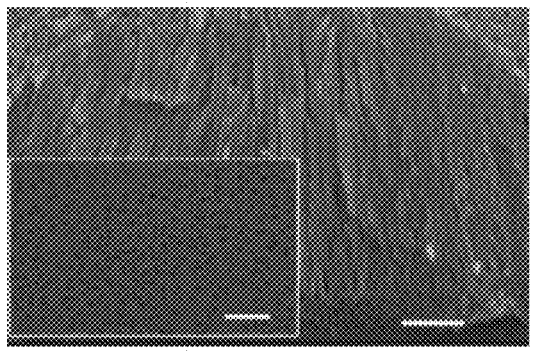
Figure 8C:
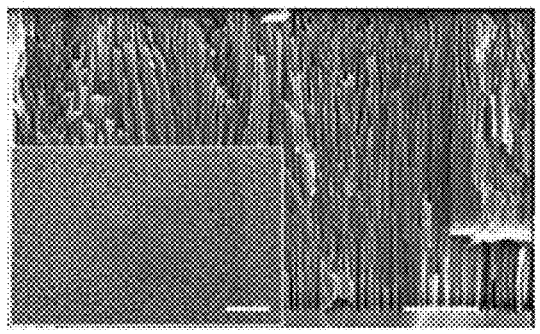
Figure 8D:
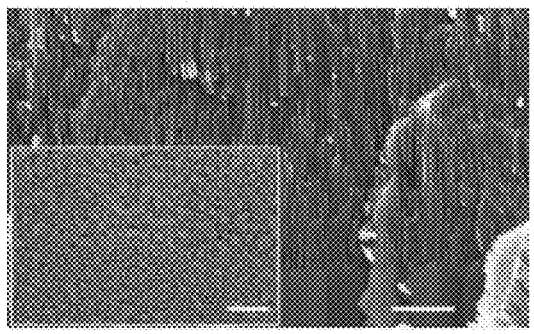
Figure 12A:
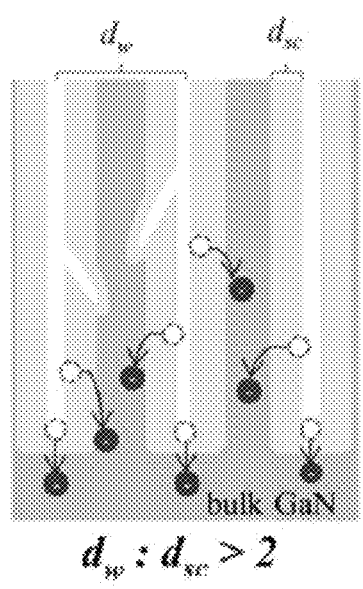
FIGS. 12A-12B are representations of possible pore morphologies based on the ratio of space charge region thickness and pore separation.
Figure 12B:
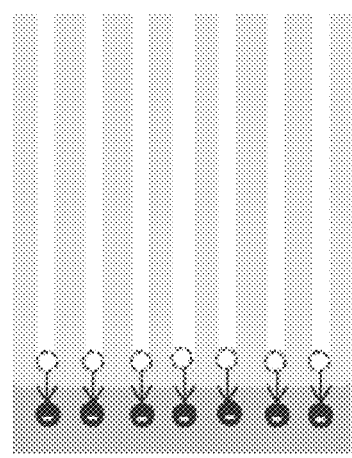

The modeling of conduction paths in the three-dimensional porous structure is a complicated case. Here, a simplified planar model is illustrated in FIGS. 12A-12B to give the trend. When $d_w > 2d_{sc}$ (FIG. 12A), there are sufficient current pathways between pores; reverse breakdown takes place in between pores and at the tips, causing horizontal widening, branching of the pores in addition to vertical downward propagation as observed in FIG. 8A. Conversely, when $d_w < d_{sc}$, as sketched in FIG. 12B, the space between pores is completely depleted due to coalescence of the space charge layers surrounding two adjacent pores. Carriers can only be supplied from underneath the pore tip, forcing the pores to propagate vertically as observed in FIG. 8D. Samples B and C represent anodization under an intermediate condition with a mixed character of vertical and inclined pores (FIGS. 8B and 8C). It is worth noting that the critical $d_w/d_{sc}$ ratio presented in this planar model is subject to modification when largely curved interface is involved, in which case this model should serve only as a qualitative guide. Except in the cases of low concentrations of electrolyte and semiconductor doping, the observed nanoporous morphology can be interpreted and rationally controlled by the depletion model $d_{sc} = \sqrt{2\epsilon\epsilon_0 U_{sc}/(qN_D)}$ where more sophisticated porosity profiles can be engineered through real-time modulation of anodization bias ($U_{sc}$) and/or the employment of doping control ($N_D$).

This example demonstrates the use of HF as a versatile and effective electrolyte in etching or porosifying n-type GaN. Rate limiting steps for this electrochemical process were investigated and identified by cyclic voltammetry. A record-high rate of porosification (>100 μm/min) was observed. A detailed mapping of the etching and porosity phase-diagrams was conducted that includes parameters such as doping level, electrolyte concentration, and anodization bias. The morphology of the nanoporous region can be understood quantitatively by a depletion-layer model. These findings can enable the rational control of porous morphology towards the fabrication of GaN structures having the desired optical, mechanical, and/or electrical properties.

Example 2

Fabrication of a MQW/Air-Semiconductor DBR Structure

This example describes in further detail the fabrication of a membrane-based GaN/air-gap DBR for blue/green light emitting devices. The formation of membrane DBRs and microcavities may employ electrochemical etching described above in which selective lateral etching of layers is achieved by adjusting the conductivity of layers rather than chemical composition. This can relieve greatly the burden in creating epitaxial DBRs. The lateral-etching process is found to be compatible with InGaN based light emitters.

The emission of InGaN multiple quantum wells (MQWs) was modified successively with the formation of a DBR underneath the MQW and the capping of the MQW with a silver top mirror. Micro-reflectance measurements of a fabricated DBR structure shows over 98% peak reflectance and a wide stopband (over 150 nm) with only four pairs of GaN/air-gap layers. Micro-photoluminescence spectra of InGaN multiple quantum wells (MQWs) on DBRs show reduced linewidth and improved emission efficiency. After capping the MQWs on DBRs with a silver reflective layer, a significant linewidth narrowing indicates the modification of spontaneous emission due to the presence of a planar microcavity. The reduction of PL linewidth from 20 to 8 nm agrees well with the theoretical prediction of the distribution of cavity modes, indicating that the GaN/air gap DBRs can be a viable building block for III-nitride photonics.

In this example, the DBR structures were grown on sapphire by metalorganic chemical vapor deposition (MOCVD) using a standard two-step growth process described in F. Bernardini et al., Phys. Rev. B, 56 (1997) R10024, which is incorporated herein by reference in its entirety. To facilitate lateral etching, windows were opened by inductively coupled plasma reactive-ion etching (ICP-RIE, Oxford Plasmalab 100) with a Ni mask to form vias in DBR stack and expose sidewalls.

Figure 13A:
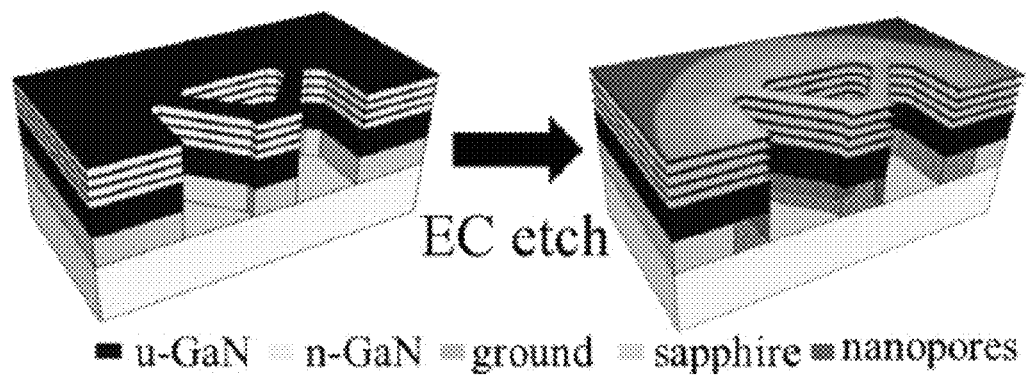
FIG. 13A depicts an embodiment of an air/semiconductor DBR structure, according to some embodiments.
Figure 13B:
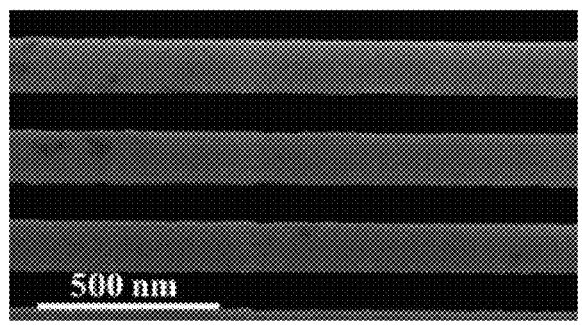
FIGS. 13B-13C show SEM micrographs of air/GaN layers of a DBR structure fabricated using electrochemical etching, according to some embodiments.

The sample was then subjected to an electrochemical etch that was carried out in a potentiostatic (constant voltage) mode without UV illumination. The electrolyte was prepared by adding ethanol/glycerol to equal part of hydrofluoric acid (HF, 49%). It was found that replacing ~⅔ of ethanol with glycerol could reduce the roughness of the etched surfaces. The formation and quality of the membrane were examined by scanning electron microscopy (SEM, Hitachi SU-70), atomic force microscopy (AFM, Veeco MultiMode), and differential interference contrast (DIC) microscopy (Nikon Optiphot). As the membrane DBRs were formed laterally with a finite spatial extent, µ-reflectance, µ-photoluminescence (µ-PL, excitation wavelength=405 nm), and µ-Raman (HORIBA Jobin Yvon, confocal LabRAMVR Raman 300) measurements were carried out with a spatial resolution of 4, 2, and 4 µm in diameter, respectively. FIGS. 13A and 13B provide conceptual sketches of the formation of a GaN membrane DBR structure using the EC etching. Four pairs of undoped (u-GaN)/n-type GaN (n-GaN, $1.2 \times 10^{19}$ cm$^{-3}$) were grown where the n-GaN region becomes the air gap during subsequent EC etching. The thickness of the undoped (GaN membrane) layer was either ¼λ, or ¾λ, (where λ~500 nm), while the thickness of n-GaN was kept at ¼λ, for mechanical stability. The use of a ¾, membrane layer has the effect of reducing the width of the stopband from 320 nm to 140 nm based on modeling using transfer matrix method. Underneath the DBR layers, an undoped GaN layer of 500 nm was used as a spacer and an etch stop. An n-GaN layer ($5 \times 10^{18}$ cm$^{-3}$) with a thickness of 500 nm was grown prior to the etch stop (shaded in light grey in FIG. 13A to ensure uniform distribution of the anodization bias across the sample (~1×1 cm²). This lower n-GaN layer is referred to as the "ground plane" or "ground layer."

Figure 13D:
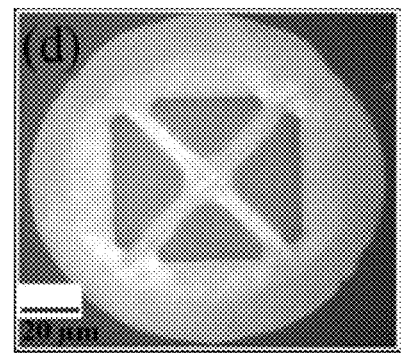
FIG. 13D shows a DIC image of a DBR structure after electrochemical etching, where the formation of air gaps between layers results in a circular pattern.
Figure 13C:

The optical quality of the finished membrane DBRs is affected by both the pattering dry etching and the EC etch. The roughness of the ICP-etched sidewall was found to be correlated with striations formed on the GaN membrane surface. The chlorine based ICP-RIE process needed to be adjusted to minimize corrugation of the via sidewall surfaces. The parameters of lateral HF EC etching have been explored in D. Chen et al., *J. App. Phys.*, 112 (2012) p. 064303. In general, a lower anodization voltage (<20 V) results in smoother surface and a reduced etching rate. We also note that the quality of EC etching in such a close-spaced configuration (0.2 µm) depends on the effective transport of electrolyte to the etching surface. The partial substitution of ethanol with glycerol was found useful in further improving the membrane smoothness. FIGS. 13B-13C show cross-sectional SEM images, and a plan-view DIC picture (FIG. 13D) with a pattern that correlates with the schematic of FIG. 13A. The sharp transition between GaN membrane and air is clearly shown in FIGS. 13B-13C demonstrates that good quality DBR can be maintained over a long distance. The surface roughness can be maintained under 5 nm (root mean square, RMS value) over an area of 5×5 µm² at a bias of approximately 12 V. The lateral etch rate at this bias was estimated to be 5 µm/min. The DBR regions were formed around the windows over a length of 10 to 30 µm. Substantial color contrast can be seen in FIG. 13D. The outer, lighter circle defines the range where DBR structure was formed laterally. The inner (and somewhat non-uniform) circle is a result of unintentional porosification of the ground-plane at roughly half the rate.

Figure 14:
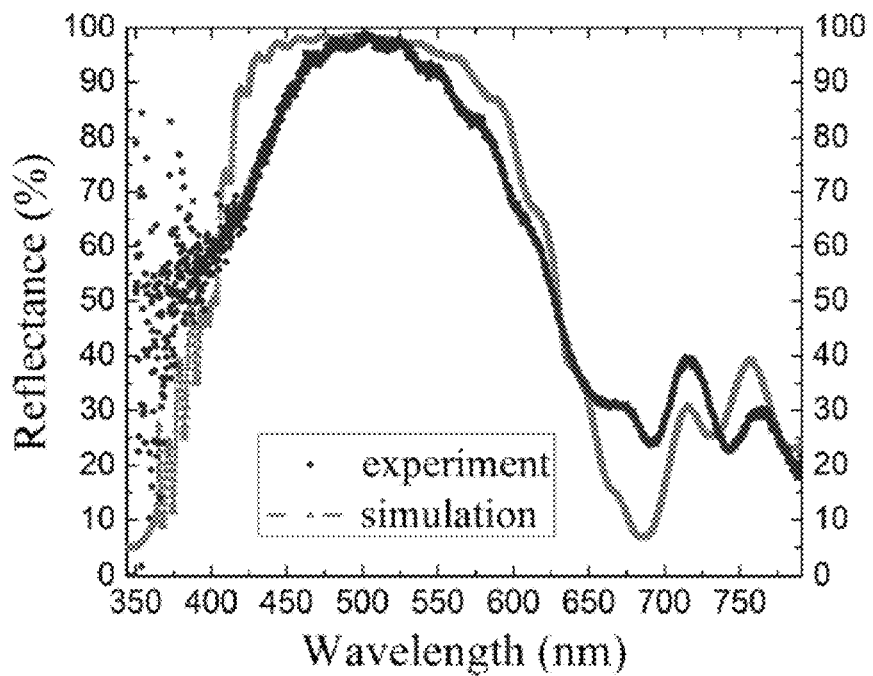
FIG. 14 shows measured and simulated reflectance spectra for a DBR structure; according to some embodiments.

The result from pt-reflectance measurement is shown in FIG. 14 (darker trace). Absolute reflectance value was obtained from calibration with a standard silver mirror (Thorlabs PF03-03-P0123) over 340-800 nm and the accuracy is further checked with a sapphire wafer. With four pairs of GaN/airgap layers, the peak reflectance exceeds 98% at λ=503 nm, and the width of the stopband is around 150 nm, which is three to five times wider than reported epitaxial DBR mirrors. The measured reflectance spectrum is also compared to a theoretical model (FIG. 14, lighter trace) that is calculated using the transfer matrix method, taking into account the effect of oblique incident/collection angle (half angular range ~10°). Absorption of GaN is included through a wavelength-dependent, complex index of refraction. A scattering loss from surface roughness of 4 nm RMS is assumed. The discrepancy between the measured reflectance spectrum and the simulation is likely due to the fluctuation of the of air-gap thickness in the membrane-based DBRs.

Figure 15:
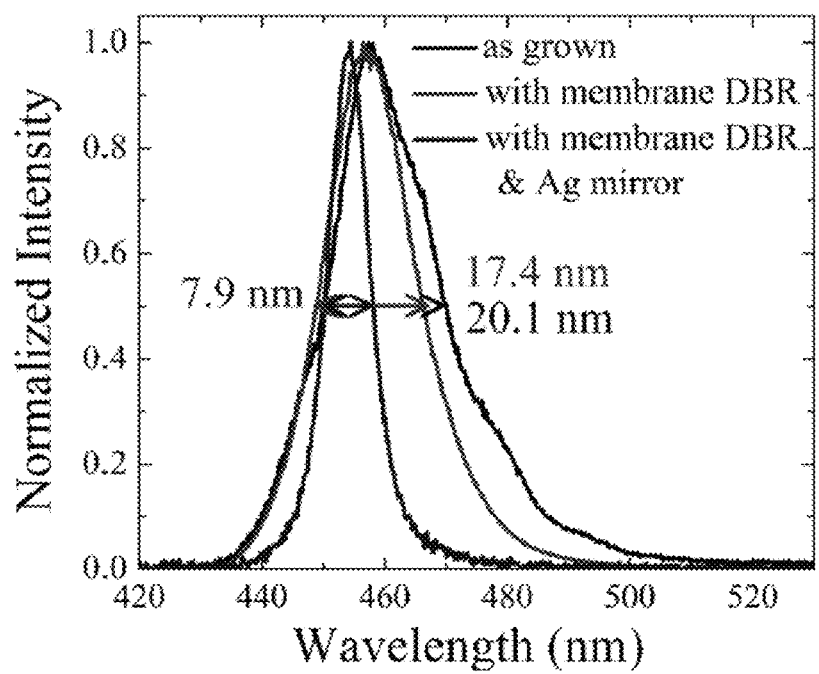
FIG. 15 shows emission spectra of MQWs samples (1) without DBRs, (2) with bottom DBRs, and (3) with bottom DBRs and silver capping layer, where significant linewidth narrowing can be seen for samples with DBRs.

Toward the fabrication of InGaN microcavity devices, an active region was prepared consisting of 30 pairs of $In_{0.06}Ga_{0.94}N$ (2 nm)/GaN (2 nm) superlattices (SLs) and 10 periods of $In_{0.17}Ga_{0.83}N$ (3 nm)/GaN (8 nm) MQWs, on top of four periods of undoped/n-type GaN designed to form ¾λ, DBR for 460 nm emission. The sample was similarly patterned by ICP etching and EC etched to form the membranes of the DBR structure. The MQWs remained intact after the EC etching. The µ-PL spectra (spot diameter 2 µm) of as-grown (black, broad trace) and with/without membrane DBRs are shown in FIG. 15. A significant linewidth narrowing effect of the MQWs with DBR can be seen. The spectra of as grown sample (black) and after EC etching (middle, gray trace) are shown in FIG. 15. Emission from the as-grown MQW exhibits typical fringes due to the interference effect of reflections at GaN/sapphire and GaN/air interfaces. The full-width-half-maximum (FWHM) of the spontaneous emission is around 20 nm and in good agreement with the reported data. After the EC etch, the µ-PL spectrum (middle, gray trace) shows a reduced linewdth (17 nm), a five to ten times increase in intensity, and the disappearance of interference fringes as the effective cavity width was reduced to 0.38 µm estimated by summing up the thicknesses of InGaN MQWs, InGaN SLs and the penetration depth into the DBR. We note that the linewidth reduction of less than 20% is due to the fact that the upper "mirror" has rather limited reflectivity (18%). To improve the quality of the micro-cavity, 50 nm of silver (with a measured reflectance at 460 nm=70%) was deposited on a piece of EC etched sample using e-beam evaporation. Normalized µ-PL spectrum in FIG. 15 (narrow, gray trace) shows a further reduction in linewidth to less than 8 nm.

Figure 16:
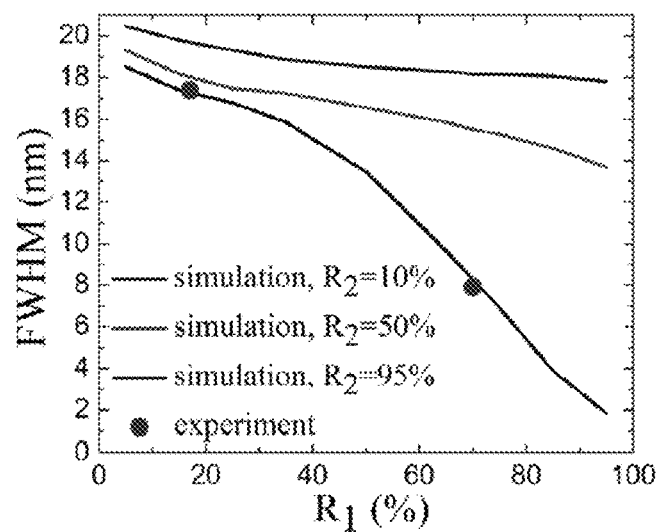
FIG. 16 illustrates FWHM linewidths from experiment and from simulated spectra of emitters in a cavity, where agreement between experiments and simulation of high reflectance bottom DBRs indicates membrane DBRs can be used to improve spectral purity via optical cavity modes.

To ascertain the optical quality of the bottom GaN/air membrane DBRs, we modeled the linewidth of the spontaneous emission by fitting the experimental linewidths with two different top mirrors (R1=18% and 70%), using the reflectivity of the bottom mirror (R2) as the fitting parameter. For each combination of R1 and R2, the predicted linewidth is obtained semi-empirically by convoluting the theoretical density of cavity modes with the measured spectrum of as-grown InGaN MQW sample assuming thick-cavity effect is negligible. The calculated linewidths versus R1 (top mirror) for three separate values of R2 (10%, 50%, and 95%) are shown in FIG. 16, together with the experimental data. Qualitatively, a low-reflectivity top mirror (left part of FIG. 16) will diminish the cavity effect, and the quality of the bottom mirror (R2) is best revealed with a highly reflective top mirror (R1, lower right part of FIG. 16). Preparation of a dielectric top mirror is currently in progress. The good agreement between the experimental and simulated FWHM with highly reflective bottom DBR indicates that the high reflectance membrane DBR can be used to control the modes of spontaneous emission.

Figure 17A:
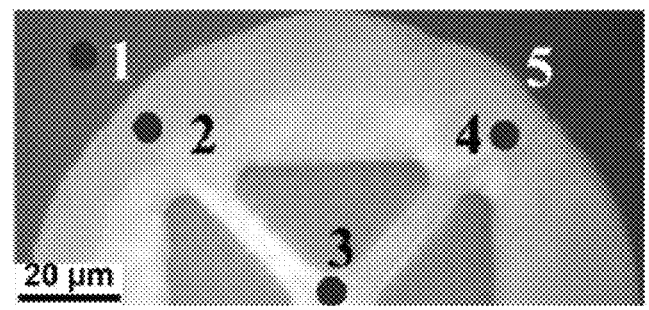
FIG. 17A shows a DIC image of the measurement spots on an EC etched sample with MQWs.
Figure 17B:
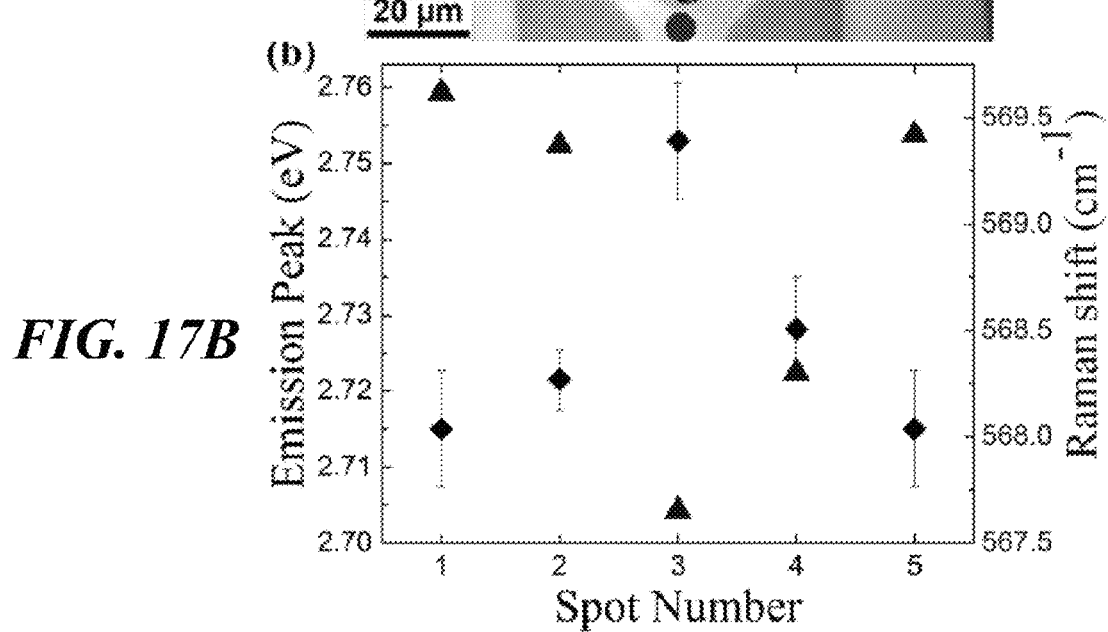
FIG. 17B illustrates the corresponding emission peak and Raman shift at the measured spot locations.

To ascertain the effect of underlying DBR formation on the optical emission, λ-PL measurement was performed on a sample prior to the silver coating, from a region unaffected by the EC etching (spot 1 in FIG. 17A), to an area where the membrane DBRs are formed underneath (spot 2), then to the center of the etched pattern that can be considered freely suspended (spot 3). The measurement continued along a separate branch (spots 4 and 5) for a consistency check. FIG. 17B plots the peak energy of μ-PL determined at each point. A systematic blue shift amounting to 35-40 meV was observed. Since the distances among all spots measured were within 100 μm, the inhomogeneity in composition or thickness due to growth is tentatively ruled out. The systematic emission peak shift can be a result of the reduced piezoelectric effect as InGaN/GaN MQWs undergo relaxation during the formation of membrane DBR. To determine the change of strain, μ-Raman was carried out on the exact spots and summarized as triangles in FIG. 17B. A shift of the $E_2^H$ from 569.6 cm$^{-1}$ (as grown) to 567.7 cm$^{-1}$ (after EC etch) corresponds to the relief of a compressive strain of 0.104% as a result of EC lateral etching, in good agreement with the reported data of residual strain for GaN on sapphire. The corresponding change in piezoelectric field can be calculated with known parameters and the total electric field can be calculated. Solving the Schrödinger equation for electrons and heavy holes, the effective band gap of strain relaxed MQWs was found to be about 34 meV larger than the strained ones. The good agreement between experimental and theoretical results suggests that the piezoelectric effect is the dominant factor responsible for the observed emission shift. It is noteworthy that the emission peak of the silver coated sample exhibits a further blue-shift in FIG. 15. Possible causes contributing to the blue-shift include coupling between the MQW emission and surface plasmons (SPs) and wavelength variation across sample (<2 nm).

This example demonstrates an embodiment of a method that may be used to produce highly reflective short-wavelength membrane DBRs (e.g., air/semiconductor DBRs) that may be used to fabricate innovative high performance GaN-based optical devices.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A method for laterally etching III-nitride material, the method comprising:
   depositing a first layer of III-nitride material having a first n-type conductivity on a substrate;
   depositing a second layer of material over the first layer;
   forming a via in the second layer to expose a surface area of the first layer;
   electrochemically and laterally etching the first layer using a hydrofluoric-based etchant to selectively remove at least a portion of the first layer, wherein the removed portion of the first layer extends under the second layer and wherein the etching does not require illumination.

2. The method of claim 1, wherein the hydrofluoric-based etchant is non-aqueous.

3. The method of claim 1, wherein the hydrofluoric-based etchant comprises ethanol.

4. The method of claim 3, wherein the hydrofluoric-based etchant further comprises glycerol.

5. The method of claim 1, wherein the first layer has an n-type dopant concentration greater than $10^{17}$ cm$^{-3}$.

6. The method of claim 1, wherein the first layer and second layer comprise GaN.

7. The method of claim 1, wherein the second layer comprises a III-nitride material of a different conductivity than the first layer.

8. The method of claim 1, further comprising laterally etching the at least a portion of the first layer for a lateral distance of more than approximately 5 microns.

9. The method of claim 1, further comprising:
   depositing a conductive ground plane proximal to the first layer; and
   forming the via to extend to the conductive ground plane.

10. The method of claim 9, wherein the conductive ground plane extends laterally across a region of the first layer that is etched.

11. The method of claim 1, further comprising depositing a multi-layer stack of the first layers and the second layers, wherein the first layers and second layers alternate in the multi-layer stack.

12. The method of claim 11, wherein the via is formed through the multi-layer stack to expose side-wall surface areas of the first layers.

13. The method of claim 12, wherein the electrochemical etching removes portions of the first layers to form a region having at least two second layers separated by a layer of air.

14. The method of claim 12, wherein the electrochemical etching removes portions of the first layers to form a region having at least two second layers having layers of air on opposing sides of the second layers.

15. The method of claim 14, wherein the etched multi-layer stack comprises a DBR structure.

16. The method of claim 14, wherein the etched multi-layer stack comprises a DBR structure for a vertical cavity surface emitting layer.

17. The method of claim 14, wherein a number of second layers having layers of air on opposing sides of the second layers is four.

18. The method of claim 14, further comprising depositing a MQW structure adjacent the multi-layer stack.

19. The method of claim 18, further comprising depositing a dielectric DBR structure or a metallic film adjacent the MQW structure.

20. A method for etching III-nitride material, the method comprising:
   depositing a first layer of III-nitride material having a first n-type conductivity on a substrate;
   depositing a second layer of material adjacent the first layer;
   electrochemically and laterally etching the first layer using a hydrofluoric-based etchant to selectively remove at least a portion of the first layer that extends along the second layer without substantial removal of the second layer, wherein the etching does not require illumination.

21. The method of claim 20, wherein the first or second layer comprises a layer of an LED device.

22. The method of claim 21, wherein the LED device is a microcavity LED or a resonant cavity LED.

23. The method of claim 20, wherein the hydrofluoric-based etchant contains ethanol.

24. The method of claim 23, wherein the hydrofluoric acid before dilution with ethanol is approximately 50% volume in water.

25. A method for forming a distributed Bragg reflector (DBR) laser comprising III-nitride material, the method comprising:
depositing a first multi-layer structure on a substrate, the first multi-layer structure comprising first and second layers, wherein the first layers have a conductivity different than that of the second layers;
depositing a multiple quantum well (MQW) active structure adjacent the first multi-layer structure;
forming vias into the first multi-layer structure so as to provide access for an etchant to the second layers;
laterally and electrochemically etching the second layers with a hydrofluoric-based etchant so as to selectively remove at least a portion of the second layers and form a DBR structure adjacent the MQW region, wherein the etching does not require illumination and wherein the DBR structure comprises at least two first layers separated by one or more layers of air.

26. The method of claim 25, wherein the etching comprises subjecting the first multi-layer structure to an etchant comprising hydrofluoric acid, ethanol, and glycerol.

27. The method of claim 26, wherein the etching comprises subjecting the first multi-layer structure and etchant to an electric bias between approximately 5 volts and approximately 60 volts, and wherein an n-type dopant concentration of the second layers is between approximately $10^{17}$ cm$^{-3}$ and approximately $10^{20}$ cm$^{-3}$.

28. The method of claim 27, wherein subjecting the first multi-layer structure to an electric field comprises applying a potential difference between the etchant and the substrate that affects electropolishing or complete removal of the second layer material.

29. The method of claim 25, wherein the first layers and second layers comprise GaN.

30. The method of claim 29, wherein the second layers comprise n-type conductivity material having a dopant concentration between approximately $3 \times 10^{18}$ cm$^{-3}$ and approximately $5 \times 10^{19}$ cm$^{-3}$.

31. The method of claim 25, wherein the thicknesses of the first layers are substantially the same.

32. The method of claim 25, wherein the thicknesses of the first layers correspond to approximately one-quarter of a selected emission wavelength for the laser.

33. The method of claim 25, wherein the removed portions of the second layers and remaining first layers form a structure having periodic contrast of optical refractive index.

34. The method of claim 1, further comprising applying a bias of between approximately 5 volts and approximately 60 volts, wherein a dopant concentration of the first layer is between approximately $10^{17}$ cm$^{-3}$ and approximately $10^{20}$ cm$^{-3}$.

35. The method of claim 1, further comprising applying a bias of between approximately 10 volts and approximately 30 volts, wherein a dopant concentration of the first layer is between approximately $3 \times 10^{18}$ cm$^{-3}$ and approximately $5 \times 10^{19}$ cm$^{-3}$.

* * * * *